US009805790B2

(12) United States Patent
August et al.

(10) Patent No.: US 9,805,790 B2
(45) Date of Patent: Oct. 31, 2017

(54) MEMORY CELL WITH RETENTION USING RESISTIVE MEMORY

(71) Applicant: Intel Corporation, Santa Clara, CA (US)

(72) Inventors: Nathaniel J. August, Portland, OR (US); Pulkit Jain, Hillsboro, OR (US); Stefan Rusu, Sunnyvale, CA (US); Fatih Hamzaoglu, Portland, OR (US); Rangharajan Venkatesan, Hillsboro, OR (US); Muhammad Khellah, Tigard, OR (US); Charles Augustine, West Lafayette, IN (US); Carlos Tokunaga, Hillsboro, OR (US); James W. Tschanz, Portland, OR (US); Yih Wang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/025,229

(22) PCT Filed: Dec. 5, 2013

(86) PCT No.: PCT/US2013/073440
§ 371 (c)(1),
(2) Date: Mar. 25, 2016

(87) PCT Pub. No.: WO2015/084381
PCT Pub. Date: Jun. 11, 2015

(65) Prior Publication Data

US 2016/0232968 A1 Aug. 11, 2016

(51) Int. Cl.

| | |
|---|---|
| ***G11C 13/00*** | (2006.01) |
| ***G11C 14/00*** | (2006.01) |
| ***G11C 11/16*** | (2006.01) |

(52) U.S. Cl.
CPC ........ *G11C 13/0061* (2013.01); *G11C 11/161* (2013.01); *G11C 11/1657* (2013.01);
(Continued)

(58) Field of Classification Search
CPC ............. G11C 13/00; G11C 7/00–7/10; G11C 11/00–11/56; G11C 14/00; G11C 11/1657; G11C 11/1675; G11C 11/1693
See application file for complete search history.

(56) References Cited

U.S. PATENT DOCUMENTS

| | | |
|---|---|---|
| 7,719,876 B2 | 5/2010 | Chevallier et al. |
| 2005/0040881 A1 | 2/2005 | Brown et al. |

(Continued)

FOREIGN PATENT DOCUMENTS

| | | |
|---|---|---|
| EP | 0619545 | 9/2001 |
| KR | 10-2011-0102403 | 9/2011 |

OTHER PUBLICATIONS

Notification Concerning Transmittal of International Preliminary Report on Patentability issued for International Patent Application No. PCT/US2013/073440, dated Jun. 16, 2016.

(Continued)

*Primary Examiner* — Hien Nguyen
(74) *Attorney, Agent, or Firm* — Blakely Sokoloff Taylor and Zafman LLP

(57) ABSTRACT

Described is an apparatus including memory cell with retention using resistive memory. The apparatus comprises: memory element including a first inverting device cross-coupled to a second inverting device; a restore circuit having at least one resistive memory element, the restore circuit coupled to an output of the first inverting device; a third inverting device coupled to the output of the first inverting device; a fourth inverting device coupled to an output of the third inverting device; and a save circuit having at least one
(Continued)

resistive memory element, the save circuit coupled to an output of the third inverting device.

20 Claims, 14 Drawing Sheets

(52) U.S. Cl.
CPC ...... *G11C 11/1659* (2013.01); *G11C 11/1675* (2013.01); *G11C 13/0011* (2013.01); *G11C 13/0014* (2013.01); *G11C 14/009* (2013.01); *G11C 14/0081* (2013.01); *G11C 11/1693* (2013.01)

(56) References Cited

U.S. PATENT DOCUMENTS

2006/0092711 A1 5/2006 Kant et al.
2007/0057792 A1 3/2007 Alden
2007/0164383 A1 7/2007 Chen et al.
2010/0148039 A1 6/2010 Gratz et al.
2011/0298517 A1 12/2011 Pal
2012/0224406 A1 9/2012 Chung
2012/0280713 A1 11/2012 Katoh
2013/0194862 A1 8/2013 Jung et al.
2016/0172036 A1* 6/2016 Augustine .......... G11C 14/0081 365/66

OTHER PUBLICATIONS

Office Action for corresponding U.S. Appl. No. 14/129,676, 10 pages, dated Apr. 22, 2016.
International Search Report dated Sep. 11, 2014 for PCT/US2013/073440, filed Dec. 5, 2013, 5 pages.
Written Opinion of the International Searching Authority dated Sep. 11, 2014 for PCT/US2013/073440, filed Dec. 5, 2013, 7 pages.

* cited by examiner

| Q | MTJ1 |
|---|---|
| 1 | Low R |
| 0 | High R |

| Q | MTJ2 |
|---|---|
| 1 | High R |
| 0 | Low R |

1030

MEMORY CELL WITH RETENTION USING RESISTIVE MEMORY

RELATED APPLICATION

This patent application is a U.S. National Phase Application under 35 U.S.C. §371 of International Application No. PCT/US2013/073440, filed Dec. 5, 2013, entitled MEMORY CELL WITH RETENTION USING RESISTIVE MEMORY.

BACKGROUND

Processors and SoCs (System-on-Chip) are power constrained and employ power gating to "turn off" blocks (i.e., to enter sleep state for logic blocks) which are not in use, saving leakage power. Traditionally, switching a block into sleep state requires time in order to save any data which must be retained for correct operation. This data may be stored in embedded memory arrays, flip-flops, and latches and takes time to save into "Always-ON" storage, as well as time to restore the stored data when power is again applied to the logic block. Saving and restoring data limits how frequently the logic block can be power gated, and also incurs a power penalty which reduces the overall gains.

The standard method for saving and restoring data involves moving the data into a memory array which is always powered up. Alternatively, state retention flip-flops can used to locally save the required data in the flip-flops themselves, by isolating a portion of the flip-flop and connecting it to an Always-ON supply. These flip-flops allow fast save and restore since the state (i.e., data) does not need to be moved into a memory array which is always powered up. However, such flip-flops require an Always-ON supply to be routed to every state retention flip-flop, and a portion of the flip-flop consumes leakage power even during sleep mode.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
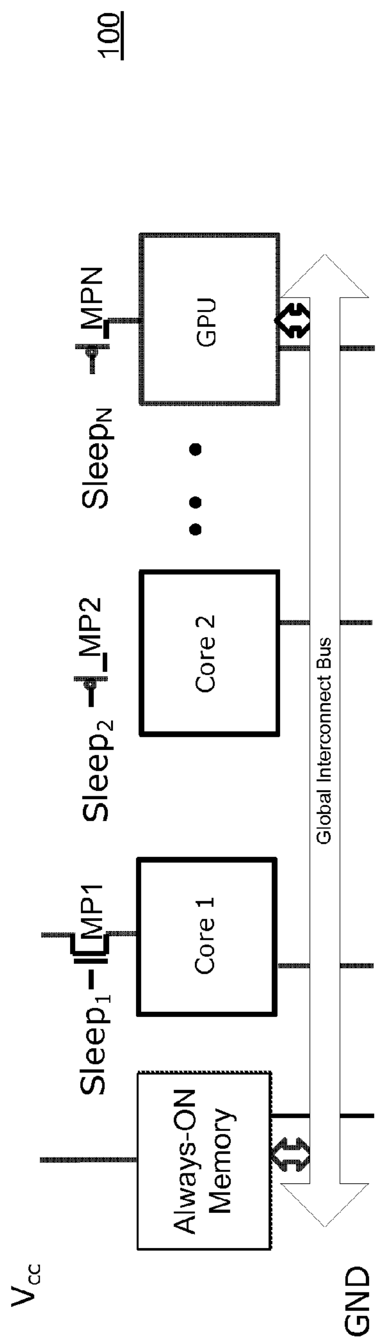
FIG. 1A illustrates traditional retention architecture for sequential units using an always-on memory unit.

FIG. 1A illustrates traditional retention architecture 100 for sequential units using an always-on memory unit. Architecture 100 shows a plurality of processing units (e.g., Core 1, Core 2, Graphics Processor Unit (GPU)), an on-chip Always-ON memory, sleep transistors MP1-MPN (where 'N' is an integer), Global Interconnect Bus (GIB), power supply (Vcc), and ground (GND) rails. Each of the sleep transistors MP1-MPN is controlled by respective sleep signals (i.e., Sleep1-SleepN). The sleep transistors are coupled between main power supply Vcc and power supply to the plurality of processing units. During sleep mode, sleep transistors MP1-MPN are turned OFF, cutting the power to the plurality of processing units. In this standard method for saving and restoring data, data is moved from the plurality of processing units via a GBI into a memory array which is always powered up. The extra Always-ON memory array increases overall area and power consumption. Furthermore, restore and save operations take time because data has to move through GIB into and from respective memory units in the plurality of processing units.

Figure 1B:
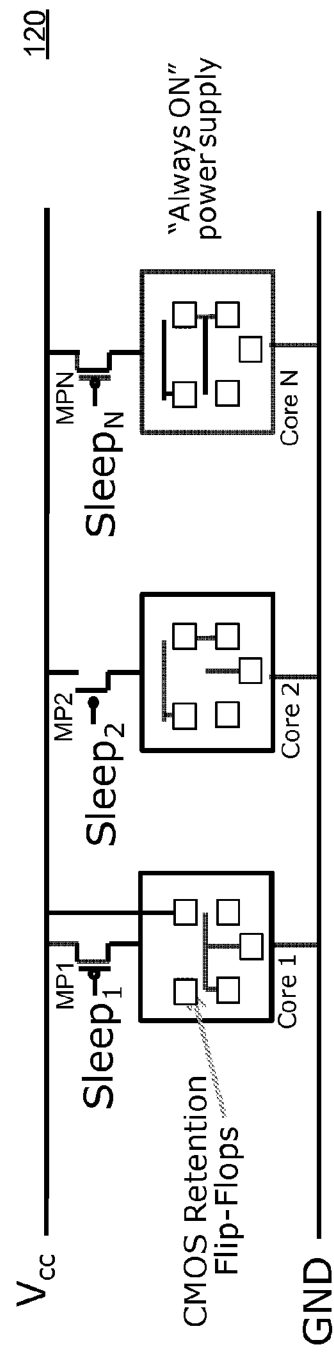
FIG. 1B illustrates traditional retention architecture for sequential units using always-on supply for each sequential unit.

FIG. 1B illustrates traditional retention architecture 120 for sequential units using always-on supply for each sequential unit. Architecture 120 shows a plurality of units (e.g., Core 1-N, where 'N' is an integer), sleep transistors MP1-MPN, power supply Vcc, and ground (GND) rails. Here, each processing unit includes "retention" flip-flops which may have a portion of its circuit operating from Always-ON power supply (i.e., they are not affected by the sleep transistors). Each of the sleep transistors MP1-MPN is controlled by respective sleep signals (i.e., Sleep1-SleepN). The sleep transistors are coupled between main power supply Vcc and power supply to the plurality of processing units. During sleep mode, sleep transistors MP1-MPN are turned OFF, cutting the power to the plurality of processing units. However, flip-flops operating on Always-ON power supply retain data. This architecture consumes power during sleep mode because of the Always-ON flip-flops.

Figure 1C:
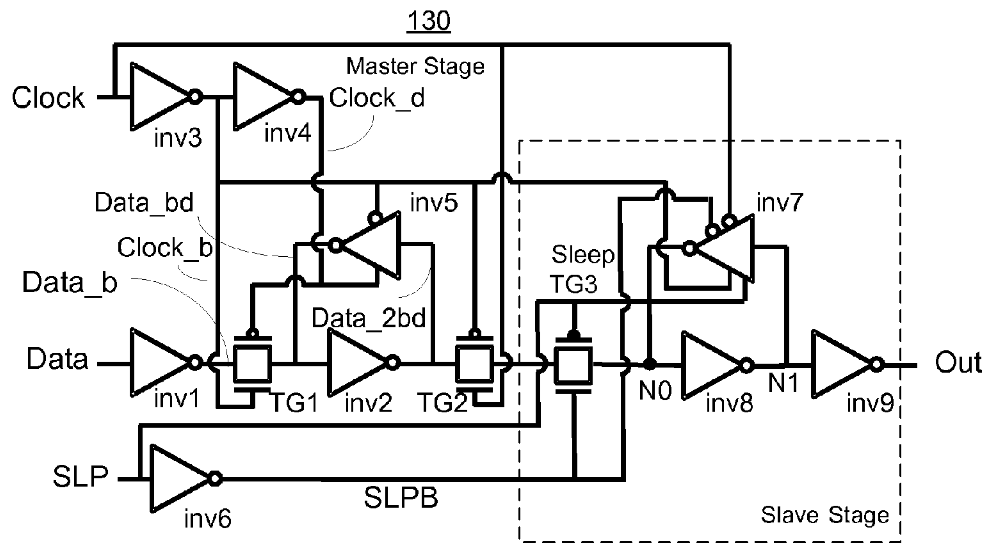
FIG. 1C illustrates a traditional CMOS retention flip-flop with some circuits operating on always-on supply.

FIG. 1C illustrates a traditional CMOS retention flip-flop 130 with some circuits operating on always-on supply. Flip-flop 130 shows inverters inv1, inv2, inv3, inv4, inv5, inv6, inv7, inv8, and inv9; transmission gate 1 (TG1), TG2, and TG3. Here, inv5 and inv7 are tri-stable inverters where, inv5 is tri-stable by clock signals (i.e., Clock_d and Clock_b) while inv7 is tri-stable by clock signals (i.e., Clock and Clock_b) and sleep (SLP) and SLPB signal.

Inverter inv1 receives input Data and generates Data_b which is received as input by TG1. Here, labels for signal names and node names are interchangeably used. For example, Data_b refers to node Data_b or signal Data_b depending on the context of the sentence. TG1 is connected to inv2 which receives Data_bd (i.e., delayed version of Data_b) and generates Data_2*bd*. TG1 is controllable by Clock_b (i.e., an inverse of Clock signal) and Clock_d (i.e., buffered version of Clock signal). Clock_b is received by inv4 which outputs Clock_d. Inverter inv5 receives Data_2*bd* and generates Data_bd. TG2 receives Data_2*bd* and provides it to the Slave Stage. TG2 is controllable by Clock_b and Clock_d signals such that when TG1 is turned ON, TG2 is turned OFF and visa versa. Inverter inv3 receives Clock and generates Clock_b signal. TG3 receives output from TG2 and provides it to N0. TG3 is controllable by SLPB (i.e., an inverse of SLP) and SLP (i.e., Sleep) signals. Inverter inv6 receives SLP and generates SLPB. Inverter inv7 is a tri-stable inverter which is controllable by Clock, Clock_b, SLP, and SLPB signals. Inverters inv8 and inv7 form the cross-coupled inverters. Output N1 of inv8 is coupled to inputs of inverters inv7 and inv9. Output of inverter inv7 is coupled to N0. "Out" is the output of the Slave Stage which is generated by inverter inv9.

In this design, the Slave Stage of flip-flop 130 is powered by an "Always-ON" supply which is kept ON during sleep state by asserting the SLP signal. As a result, the state of flip-flop 130 is retained when the regular supply is power-gated. In this design, the use of Always-ON power supply increases cost and area because a separate power supply is routed to all the retention flip-flops in the design. In this design, leakage power consumption still exists even during the sleep state because of the transistors operating using Always-ON power supply. This design has higher CK-Q (clock to output) delay, due to series connected transmission gates between the Master and Slave Stages and higher area compared to standard retention-less flip-flop. Flip-flop 130 isolates the slave stage of the flip-flop during sleep mode (i.e., when signal Sleep (SLP) is logical high) and maintains the logic state on nodes N1 and N0 with an Always-ON power supply.

Figure 1D:
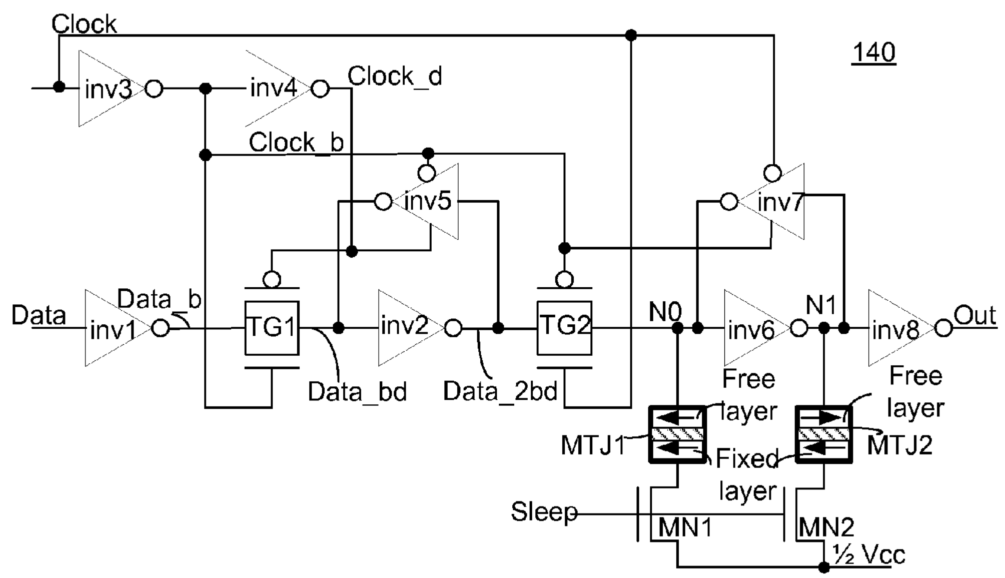
FIG. 1D illustrates a traditional retention flip-flop with two MTJ (magnetic tunnel junction) devices.

FIG. 1D illustrates a traditional retention flip-flop 140 with two MTJ (magnetic tunnel junctions) devices. Flip-flop 140 consists of a Master Stage having inverters (inv) inv1, inv2, inv3, inv4, and inv5, and transmission gate 1 (TG1); a Slave Stage having inv6, inv7, and inv8, and TG2; and Retention Stage having two MTJ devices—MTJ1 device and MTJ2 device, and sleep transistors MN1 and MN2, coupled together as shown.

Inv1 receives input Data signal on node Data and generates an inverted version of Data signal on node Data_b. Here, labels for signals and nodes may be interchangeably used. For example, Data may refer to Data node or Data signal, depending on context of the sentence. TG1 is coupled between nodes Data_b and Data_bd. TG1 receives signal Data_b and provides signal Data_b as signal Data_bd on node Data_bd when TG1 is enabled. TG1 is enabled when signal Clock_b is logical high and signal Clock_d is logical low.

Signal Data_bd is received by inv2 which generates an inverted version of signal Data_bd i.e., signal Data_2*bd* on node Data_2*bd*. Inverters inv3 and inv4 are in the clock path. Inverter inv3 receives signal Clock and generates an inverted version of signal Clock as signal Clock_b on node Clock_b. Inverter inv4 receives signal Clock_b on node Clock_b and generates an inverted version of signal Clock_b as signal Clock_d on node Clock_d. Inverter inv5 is used to save data in the master stage. Inverter inv5 is coupled to nodes Data_2*bd* and Data_bd. Inverter inv5 is clock gated i.e., it inverts its input when it is enabled by Clock_b and Clock_d signals.

Output of inv2 is received by TG2, which when enabled provides signal Data_2*bd* to node N0. Inverters inv6 and inv7 are cross-coupled inverters and form a memory element of the slave stage. Inverter inv7 is clock gated like inv5. Output of inv6 is node N1 which is coupled to inv8. Inverter inv8 generates the final output Out. Source/Drain terminals of sleep transistors MN1 and MN2 are tied to Always-ON half supply (½ Vcc) to retain data at nodes N0 and N1. MN1 and MN2 are controlled by signal Sleep, which when enabled, couple MTJ1 and MTJ2 devices to the half supply rail, respectively.

MTJ device is a non-volatile resistive memory device formed by a stack of layers including an insulation layer formed from MgO, a free layer (i.e., free magnetic layer), and a fixed layer (i.e., fixed magnetic layer or pinned layer). The pattern region between the fixed and free layers of the MTJ device is the insulation layer. When sufficient current flows through an MTJ device, the direction of current may change the resistivity of the MTJ device such that one direction of current results in high resistivity (RH) while another direction of current through the MTJ device results in low resistivity (RL) of the MTJ device.

Sleep state in a processor is used for decreasing overall power dissipation. Retention flip-flops (like flip-flop 140) reduce timing overhead of going into and coming out of sleep states significantly, which can enable new power saving states in processors. However, flip-flop 140 suffers from higher write energy, slower entry and exit from sleep mode, and higher retention failure probability.

The two MTJ devices store complementary data. Complementary data is stored (when entering sleep mode) with the help of half Vcc power supply. The complementary data must be correct otherwise nodes N0 and N1 of the slave stage may not have the proper last saved states. Free layers of MTJ1 and MTJ2 devices are coupled to nodes N0 and N1, while fixed layer of MTJ1 and MTJ2 devices are coupled to drain/source terminals of MN1 and MN2, respectively.

During read operation (when Sleep is logical high), the difference in current between the two MTJ device branches (i.e., complementary branches) is used to restore values in the complimentary nodes N0 and N1. When Sleep is low (i.e., active mode), the slave stage is isolated from the MTJ devices so that they do not impact the normal operation of the slave stage. The ½Vcc is used to help in writing to the MTJ devices and may not be used to maintain the logic state on nodes N0 and N1 as in the case of flip-flop 130.

When Sleep is activated (i.e., when signal Sleep is logical high), MTJ1 device to the left is programmed to the parallel (or low resistance RL) state. MTJ2 device to the right is programmed to the anti-parallel (or high resistance RH) state when data stored in the slave stage is '1' (i.e., N1 node stores '1'). The term "parallel orientation" or "parallel" in the context of MTJ device refers to both pinned and fixed magnetic layers having aligned magnetic directions. The term "anti-parallel orientation" or "anti-parallel" in the context of MTJ device refers to both pinned and fixed magnetic layers having un-aligned magnetic directions.

When data stored in the slave stage is '0' (i.e. 'N1 node stores '0'), MTJ1 device to the left is in anti-parallel state and MTJ2 device to the right is in parallel state. The necessity of routing a separate power supply to all sequential cells makes it challenging to implement flip-flops 130. In addition, retention flip-flop 140 still consumes leakage current in sleep mode. Moreover, using two MTJ devices increases overall area of flip-flop 140.

Figure 1E:
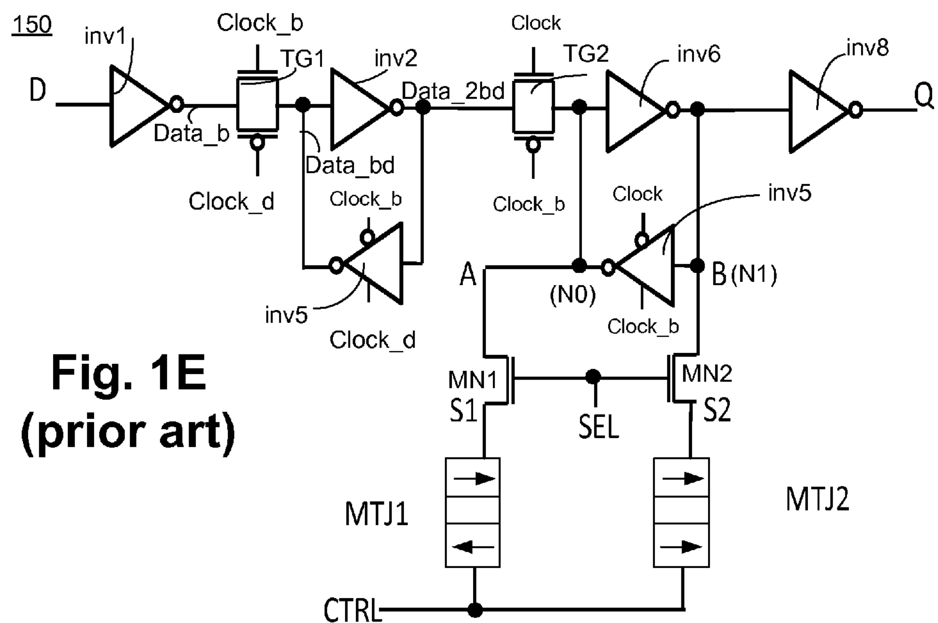
FIG. 1E illustrates a traditional retention flip-flop with two MTJ devices.
Figure 1F:
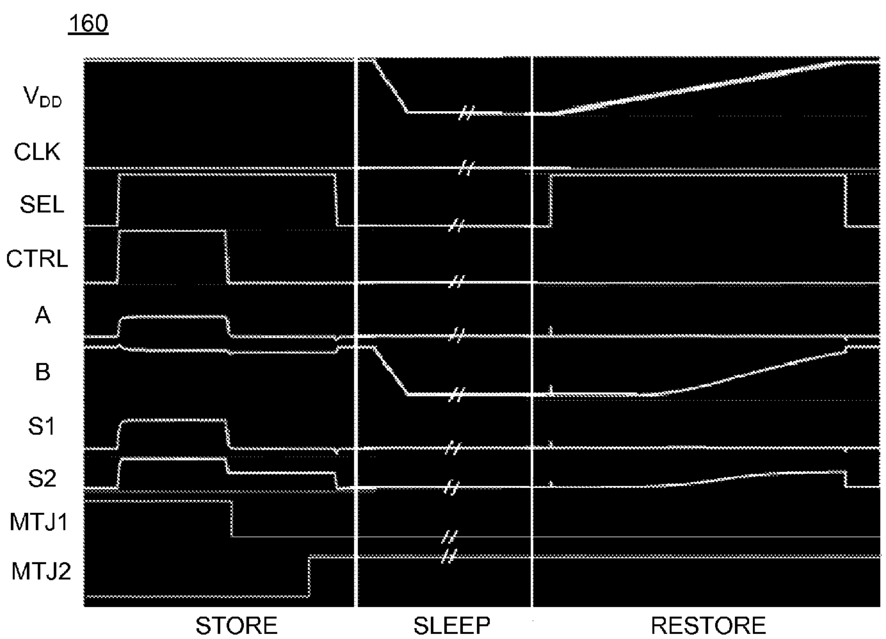
FIG. 1F illustrates the operation of the traditional retention flip-flop of FIG. 1E.

FIG. 1E illustrates a traditional retention flip-flop 150 with two MTJs (magnetic tunnel junctions). Flip-flop 140 needs ½Vcc to do the write of both MTJ devices in one step while flip-flop 150 does not need the ½Vcc but performs the write operation in two steps. In the first step CNTRL is set to high and then it is set to low. FIG. 1F illustrates a plot 160 showing the operation of the traditional retention flip-flop 150 of FIG. 1E. It is pointed out that those elements of FIGS. 1E-F having the same reference numbers (or names) as the elements of any other figure can operate or function in any manner similar to that described, but are not limited to such.

Plot 160 shows many waveforms stacked. Each waveform has its own y-axis, which is voltage from 0 to $V_{DD}$. Here, x-axis is time. Plot 160 is divided into three sections—STORE, SLEEP, and RESTORE. Plot 160 shows voltage signal behavior at nodes $V_{DD}$, CLK (i.e., Clock or Clock_d), SEL, CTRL, A, B, S1, S2, and voltages stored in MTJ1 and MTJ2 devices.

During normal operation, SEL and CTRL lines are driven low. As a result, the pass transistors MN1 and MN2, connected to the pinned layer of the MTJ devices (i.e., MTJ1 and MTJ2 devices), are turned OFF and flip-flop 150 functions like a standard retention-less flip-flop. Next, to store the state of flip-flop 150 (i.e., state of nodes A and B) into the MTJ devices, assume that node A stores '0' and node B stores '1.' First, pass transistors MN1 and MN2 are turned ON by connecting SEL line to power supply (i.e., $V_{DD}$), Clock_d (CLK) is gated (i.e., Clock_d='0') and CTRL line is driven high as shown in FIG. 1F.

This causes the current to flow from CTRL line to node A, resulting in write '0,' or changing the MTJ device resistance from anti-parallel to parallel, operation to MTJ1 device (assuming MTJ1 device is in the anti-parallel state initially). In the next step, CTRL line is driven low keeping the SEL line high. Now, the current flows from node B to CTRL line, which flips the state of MTJ2 device to anti-parallel or high resistance state, resulting in write '1' operation.

After storing the state, the supply is gated and the system enters "Sleep." Using NMOS based pass transistor results in efficient write '0' operations as NMOS is a strong conductor of '0.' However, the write '1' operation suffers from source degeneration in the MTJ flip-flop 150 requiring significant upsizing of both pass transistors as well as the pull-up PMOS transistors of the slave latch, impacting power, and delay of flip-flop 150 during normal operation.

For restoring data, the SEL line is first connected to power supply (i.e., $V_{DD}$). Then, the supply voltage is ramped up from '0' to $V_{DD}$, keeping CTRL and CLK low. This process starts charging the nodes A and B to $V_{DD}$ through the pull-up PMOS transistors of the slave stage. Simultaneously, these nodes (A and B) are discharged by the differential currents flowing through the MTJ devices. Since the resistance of MTJ1 device is low and MTJ2 device is high, voltage of node B is higher than node A. Therefore, node B gets charged to $V_{DD}$ and node A is grounded.

One of the drawbacks of FIG. 1E is its susceptibility to variations. As the supply voltage is swept from '0' to $V_{DD}$, the transistors are highly susceptible to variations at low voltages, and this results in failing the restore operation in well under 5σ (sigma) of variations. In addition, the inherent asymmetry in the slave latch causes the restore operations to fail under variations even with considerable upsizing of the transistors. Another drawback of flip-flops 140 and 150 is low read and write margins because their slave stages have unbalanced structure for writing to and reading from the MTJ devices.

Some embodiments store the state of the flip-flop into an MTJ device coupled to the slave stage of the flip-flop. Due to non-volatile nature of an MTJ device, the core power supply can be completely disabled, and there is no need for an Always-ON power supply. In some embodiments, two MTJ devices with complementary states are used in order to restore the save data with robust margin against variation.

Some embodiments provide high write current at low core power supply levels (e.g., down to a 0.7V core power supply) since they place two transistors and a single MTJ device in series for a save operation. This reduces the time and energy, since MTJ device write time increases exponentially as current is reduced. Further, by using the existing core supply at low voltages (e.g., down to 0.7V), some of the embodiments eliminate the need to route an additional power supply or to waste time and energy raising the core supply prior to a save operation. Some embodiments prevent read disturb during the restore operation by configuring each MTJ device in a series path with four small devices. Some embodiments achieve these robust save and restore operations using MTJ device resistance values (e.g., single kΩ range) that are practical in current state-of-the-art manufacturing processes.

Some embodiments maintain compatibility with existing flip-flop designs. For example, one embodiment connects to existing signals that can be ported out (e.g., a keeper node and buffered output nodes). Some embodiments add only diffusion capacitance to the keeper node and a small gate capacitance to the buffer nodes, the CLK-Q delay changes by a few percent.

Some embodiments describe variation-tolerant STT-MTJ device based retention flip-flops that use cross-coupled PMOS transistors to improve store/restore operations. Writing data to MTJ device is inherently asymmetric with "Write 1" (i.e., changing the MTJ device resistance from parallel to anti-parallel) requiring higher current than "Write 0" (i.e. changing the MTJ device resistance from anti-parallel to parallel) due to device physics. Further, traditional designs employ NMOS pass (i.e., select) transistors which further degrade write '1' operation due to the source degeneracy problem. Some embodiments couple cross-coupled PMOS transistors to MTJ device to improve write '1' operation. In some such embodiments, MTJ device's pinned layer is coupled $V_{DD}$ supply.

For restore operation, some embodiments describe a restore scheme that leverages the same cross-coupled PMOS as pre-sense amplifier. Some embodiments use a restore scheme which comprises: pre-charging, pre-sensing, and write-back operations. In one embodiment, pre-charging operation involves pre-charging internal nodes of the slave latch. In one embodiment, pre-sensing operation uses the cross-coupled PMOS transistors to pre-sense the data stored in the MTJ devices. In one embodiment, in Write-back operation, the sensed values are written back into the slave latch by turning ON the access transistors.

Figure 2A:
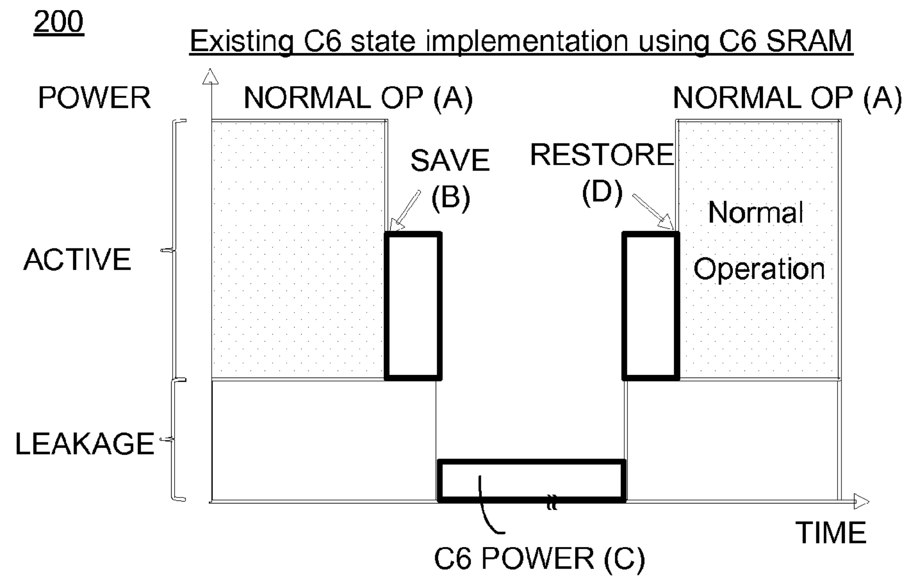
FIG. 2A illustrates plot showing power savings in C6 power state using traditional memory circuits, according to one embodiment of the disclosure.
Figure 2B:
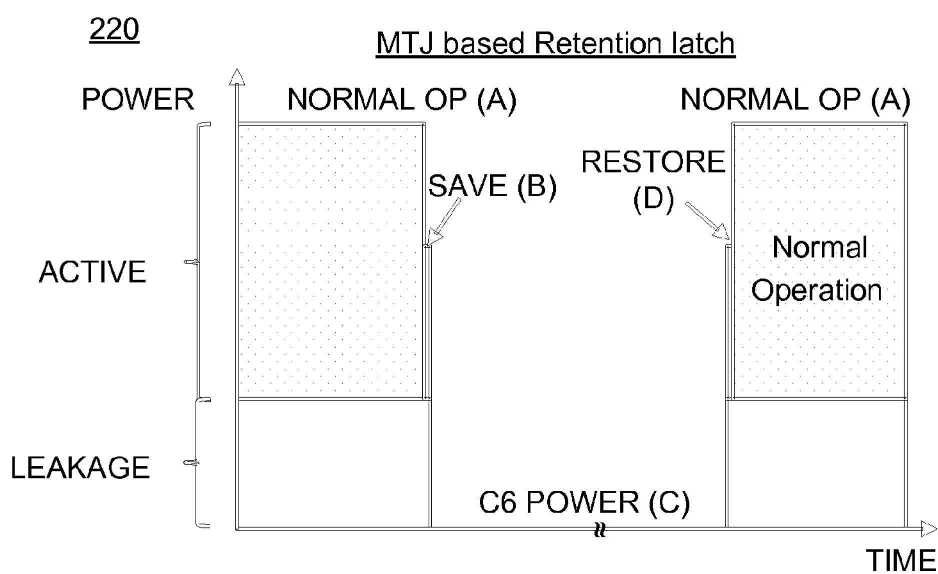
FIG. 2B illustrates plot showing power savings in C6 power state using resistive element based memory unit, according to one embodiment of the disclosure.

FIGS. 2A-B illustrate plots (200 and 220) showing power savings in C6 power state using traditional memory circuits. C6 power state is one the states described in the Advanced Configuration and Power Interface (ACPI) revision 5.0 published in Nov. 23, 2011. C6 power state is being used for exemplary purposes. The embodiments save more power than known retention apparatuses for other power states too.

Here, the x-axis is time and y-axis is power level. The total power is divided into two main categories—ACTIVE and LEAKAGE. For each of the plots, power consumption is shown for four steps—A-D. The first step is normal operation (NORMAL OP) in which the flip-flop or latch operates in non-sleep mode (i.e., active mode). The second step is save operation (SAVE (B)) in which data is saved before flip-flop or latch operates in low power mode. The third step is C6 power state (C6 POWER (C)) in which main supply to flip-flop or latch is turned OFF. The fourth step is restore operation (RESTORE (D)) in which saved data is restored after C6 power state ends.

Plot 200 shows the power consumption for an existing C6 state implementation using SRAM (Static Random Access Memory). For each step, power is consumed (i.e., leakage power is consumed in C6 state). Plot 220 shows the power consumption for some of the embodiments operating in normal mode, save/restore modes, and C6 state. Plot 220 shows that save and restore operations for some embodiments consume negligible energy, and zero (or substantially zero) power is consumed during C6 state.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 3A:
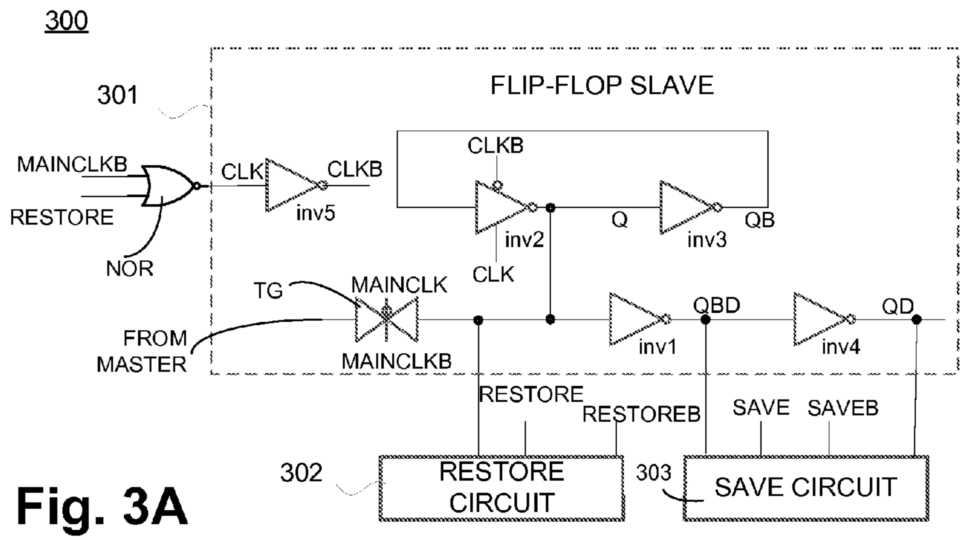
FIG. 3A illustrates a memory stage of a sequential unit with retention using resistive elements, according to one embodiment of the disclosure.

FIG. 3A illustrates a memory stage 300 of sequential unit with retention using resistive elements, according to one embodiment of the disclosure. It is pointed out that those elements of FIG. 3A having the same reference numbers (or names) as the elements of any other figure can operate or function in any manner similar to that described, but are not limited to such. So as not to obscure the embodiments, slave stage and associated circuits are shown.

In one embodiment, memory stage 300 comprises a Slave Stage 301, Restore Circuit 302, and Save Circuit 303. Slave Stage 301 can be a traditional slave stage of a flip-flop. Here, Slave Stage 301 comprises: TG which is controllable by MAINCLK and MAINCLKB signals, and inverters inv1, inv2, inv3, inv4, and inv5, where MAINCLKB signal is an inverse of MAINCLK (main clock) signal. In one embodiment, CLK and CLKB signals are generated by a NOR gate and inverter inv5 as shown. In one embodiment, NOR gate receives RESTORE signal and MAINCLKB signal and generates CLK (clock) signal, which is used to generate CLKB (i.e., inverted version of CLK). TG receives signal from a master stage (not shown). Inverter inv2 is a tri-stateable inverter which is controlled by CLK and CLKB signals.

TG is coupled to node Q which is coupled to output of inverter inv2 and inputs of inverters inv1 and inv3. Output QB of inverter inv3 is coupled to the input of inverter inv2.

Output QBD of inverter inv1 is coupled to input of inverter inv4. Output of inverter inv4 is QD. Here labels for signals and nodes are interchangeable used. For example, Q is used to refer to signal Q or node Q depending on the context of the sentence.

In one embodiment, Restore Circuit 302 is coupled to node Q and receives signals RESTORE and RESTOREB (where signal RESTOREB is an inverse of signal RESTORE). In one embodiment, Save Circuit 303 is coupled to node QBD and receives signals SAVE and SAVEB (where signal SAVE is an inverse of signal SAVEB).

In one embodiment, during normal operation (i.e., NORMAL OP (A) in FIG. 2B), RESTORE and SAVE are '0' (i.e., logical low). In this embodiment, when MAINCLK=1, data gets latched, while when MAINCLK=0, the TG is transparent for input from the master stage (i.e., TG is turned ON). In one embodiment, when a power controller (e.g., a power control unit) issues a power down command, a short SAVE state is started by the SAVE signal (i.e., SAVE (B) of FIG. 2B). After save operation is complete and data on nodes QBD and QD are saved in resistive memory elements of Save Circuit 303, Slave Stage 301 enters power saving mode. In this mode, power supply to all devices is zero or very low. At such supplies typical slave stages lose data, but in this embodiment data is saved by Save Circuit 303.

In this embodiment, no leakage power is consumed because all devices are turned OFF, and there is no Always-ON power supply. In one embodiment, when Slave Stage 301 is about to come out of low power mode (e.g., sleep mode), RESTORE signal becomes high to enable Restore Circuit 302 and SAVE signal becomes low to disable the Save Circuit 303. In one embodiment, inverter inv2 is tri-stated when RESTORE signal is high. The embodiment of FIG. 3A provides an add-on to existing slave stage designs i.e., critical path in Slave Stage 301 is not impacted for any practical purposes.

In one embodiment, Restore Circuit 302 consumes very little energy as indicated by RESTORE (D) of FIG. 2B. In one embodiment, Restore Circuit 302 restores the data content back to node Q and inv3 restores data content to node QB. In one embodiment, after data is stored back on node Q, slave stage enters normal operation (as shown by NORMAL OP (A)). An embodiment of Save Circuit 303 is discussed with reference to FIGS. 4A-C. An embodiment of Restore Circuit 302 is discussed with reference to FIG. 5.

Figure 3B:
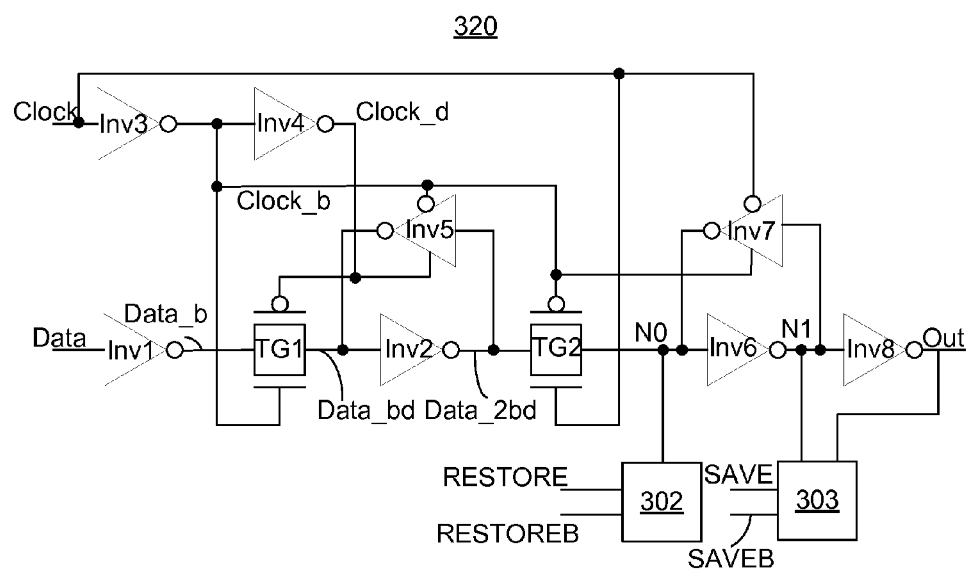
FIG. 3B illustrates a memory stage of a sequential unit with retention using resistive elements, according to one embodiment of the disclosure.

FIG. 3B illustrates a sequential unit 320 with retention using resistive elements, according to one embodiment of the disclosure. It is pointed out that those elements of FIG. 3B having the same reference numbers (or names) as the elements of any other figure can operate or function in any manner similar to that described, but are not limited to such. Embodiment of FIG. 3B is described with reference to FIG. 1D.

So as not to obscure the embodiment, differences between FIG. 1D and FIG. 3B are discussed in view of FIG. 3A. In one embodiment, instead of MTJ1 device, MTJ2 device, and pass transistors MN1 and MN2 of FIG. 1D, Restore Circuit 302 is coupled to node N0 and Save Circuit 303 is coupled to nodes N1 and Out.

In one embodiment, during normal operation (i.e., NORMAL OP (A) in FIG. 2B), RESTORE and SAVE are '0' (i.e., logical low). In this embodiment, when Clock=1, Data gets latched, while when Clock=0, TG2 is transparent for input from the master stage (i.e., TG2 is turned ON). In one embodiment, when a power controller (e.g., a power control unit) issues a power down command, a short SAVE state is started by the SAVE signal (i.e., SAVE (B) of FIG. 2B). After save operation is complete and data on nodes N1 and Out are saved in resistive memory elements of Save Circuit 303, slave stage of flip-flop 320 enters power saving mode. Here, slave stage includes inverters inv6, inv7, and inv8; and TG 2. In this mode, power supply to all devices is zero or very low. At such supplies typical slave stages lose data, but in this embodiment data is saved by Save Circuit 303.

In this embodiment, no leakage power is consumed because all devices are turned OFF, and there is no Always-ON power supply. In one embodiment, when slave stage is about to come out of low power mode (e.g., sleep mode), RESTORE signal becomes high to enable Restore Circuit 302 and SAVE signal becomes low to disable the Save Circuit 303. In one embodiment, Restore Circuit 302 consumes very little energy as indicated by RESTORE (D) of FIG. 2B. In one embodiment, Restore Circuit 302 restores the data content back to node N0 while inverter inv6 restores data content back to node N1. In one embodiment, after data is stored back on nodes N0 and N1, slave stage enters normal operation (as shown by NORMAL OP (A)).

Figure 4A:
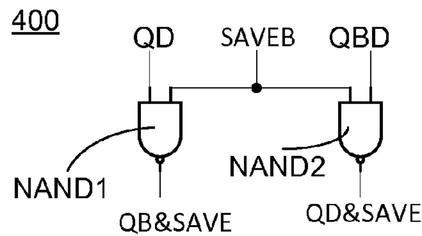
FIGS. 4A-C illustrate a Save Circuit used by the memory stage of a sequential unit with retention using resistive elements, according to one embodiment of the disclosure.
Figure 4B:
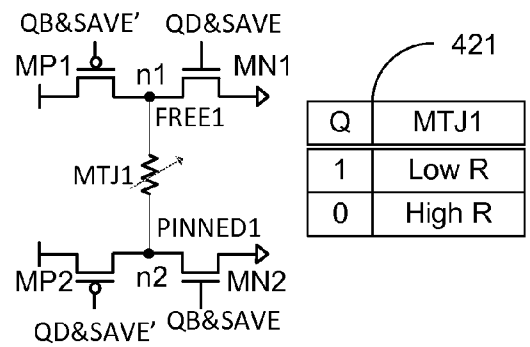
Figure 4C:
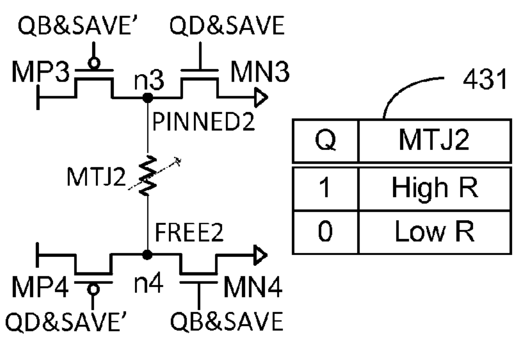

FIGS. 4A-C illustrate a Save Circuit (e.g., Save Circuit 303) used by the memory stage of sequential unit with retention using resistive elements, according to one embodiment of the disclosure. In this embodiment, no half-Vcc generation is used as required by flip-flip 140 of FIG. 1D.

In one embodiment, Save Circuit (400, 420, and 430 together) comprises logic gates e.g., NAND gates NAND1 and NAND2, that generate QB&SAVE signal and QD&SAVE signal. In this embodiment, NAND1 receives input signals QD and SAVEB while NAND2 receives input signals QBD and SAVEB. In one embodiment, Save Circuit further comprises p-type transistors MP1 and MP2, and n-type transistors MN1 and MN2, and MTH device.

In one embodiment, source terminal of MP1 (also referred as the first p-type transistor) is coupled to power supply (e.g., $V_{DD}$), drain terminal of MP1 is coupled to node n1 (i.e., drain terminal of MN1), and gate terminal of MP1 is controlled by QB&SAVE' signal, where QB&SAVE' is an inverse of QB&SAVE signal. In one embodiment, source terminal of MN1 (also referred to as the first n-type device) is coupled to ground, drain terminal of MN1 is coupled to node n1 (i.e., drain terminal of MP1), and gate terminal is controlled by QD&SAVE signal from NAND2.

In one embodiment, source terminal of MP2 (also referred as the second p-type transistor) is coupled to power supply (e.g., $V_{DD}$), drain terminal of MP2 is coupled to node n2 (i.e., drain terminal of MN2), and gate terminal of MP2 is controlled by QD&SAVE' signal, where QD&SAVE' is an inverse of QD&SAVE signal. In one embodiment, source terminal of MN2 (also referred to as the second n-type device) is coupled to ground, drain terminal of MN2 is coupled to node n2 (i.e., drain terminal of MP2), and gate terminal is controlled by QB&SAVE signal from NAND1.

In one embodiment, MTJ1 device is coupled between nodes n1 and n2 such that the free layer (i.e., FREE1) of MTJ1 device is coupled to node n1 while fixed layer (i.e., PINNED1) of MTJ1 device is coupled to node n2. Table 421 shows the operation of MTJ1 device. When magnetic directions of free layer and fixed layer of MTJ1 device are aligned, then MTJ1 device has low resistance which occurs after a save operation, where Q=1 (i.e., MTJ1 device is saving a logical high on node Q).

When magnetic directions of free layer and fixed layer of MTJ1 device are un-aligned, then MTJ1 device has high resistance which occurs after a save operation where Q=0 (i.e., MTJ1 device is saving a logical low on node Q). For an MTJ device, a large current is applied to write to the MTJ device and a smaller current is applied to read from the MTJ device. The large current is small enough to avoid destroying devices coupled to the MTJ device and the MTJ device itself. In one embodiment, the current may be controlled by adjusting the size (i.e., W/L) of devices MP1, MP2, MP3, MP4, MN1, MN2, MN3, and MN4 such that current is large enough to write the MTJ device but does not cause the MTJ device to breakdown. The sizes may be asymmetric to accommodate various NMOS/PMOS strengths and write data values. In one embodiment, the current may be controlled by the adjusting the voltage level of the control signals to MP1, MP2, MP3, MP4, MN1, MN2, MN3, MN4 such that the devices are not operating in saturation mode. In one embodiment, the current may be controlled by adjusting the voltage level of the supply signal connected to the source of devices MP1, MP2, MP3, or MP4.

In one embodiment, Save Circuit further comprises p-type transistors MP3 and MP4, and n-type transistors MN3 and MN4, and MTJ2 device. In one embodiment, source terminal of MP3 (also referred as the third p-type transistor) is coupled to power supply (e.g., $V_{DD}$), drain terminal of MP3 is coupled to node n3 (i.e., drain terminal of MN3), and gate terminal of MP3 is controlled by QB&SAVE' signal. In one embodiment, source terminal of MN3 (also referred to as the third n-type device) is coupled to ground, drain terminal of MN3 is coupled to node n3 (i.e., drain terminal of MP3), and gate terminal is controlled by QD&SAVE signal from NAND2.

In one embodiment, source terminal of MP4 (also referred as the fourth p-type transistor) is coupled to power supply (e.g., $V_{DD}$), drain terminal of MP4 is coupled to node n4 (i.e., drain terminal of MN4), and gate terminal of MP4 is controlled by QD&SAVE' signal. In one embodiment, source terminal of MN4 (also referred to as the second n-type device) is coupled to ground, drain terminal of MN4 is coupled to node n4 (i.e., drain terminal of MP4), and gate terminal is controlled by QB&SAVE signal from NAND1.

In one embodiment, MTJ2 device is coupled between nodes n3 and n4 such that the free layer (i.e., FREE2) of MTJ2 device is coupled to node n4 while fixed layer (i.e., PINNED2) of MTJ2 device is coupled to node n3. Table 431 shows the operation of MTJ2 device. When magnetic directions of free layer and fixed layer of MTJ2 device are aligned, then MTJ2 device has low resistance which occurs after a save operation, where Q=0 (i.e., MTJ2 device is saving a logical low on node Q). When magnetic directions of free layer and fixed layer of MTJ2 device are un-aligned, then MTJ2 device has high resistance which occurs after a save operation, where Q=1 (i.e., MTJ2 device is saving a logical low on node Q).

In one embodiment, the two storage resistive memory structures, MTJ1 and MTJ2 devices store the value of the slave stage. For example, if Q=1, QD=1 and SAVE=1, QD&SAVE'=0 and QD&SAVE=1, the save circuit 303 (i.e., 400, 420, and 430 together) sends current through MTJ1 and MTJ2 devices, such that it writes a low resistance "Low R" and a high resistance "High R" into MTJ1 and MTJ2 devices, respectively. In one embodiment, for circuit 420, to store or save a "zero," MP1 and MN2 are turned ON causing current to flow from MP1 to MN2 via MTJ1 device.

In one embodiment, for circuit 420, to store or save a "one," MP2 and MN1 are turned ON causing current to flow from MP2 to MN1 via MTJ1 device. In one embodiment, for circuit 430, to store or save a "one," MP4 and MN3 are turned ON causing current to flow from MP4 to MN3 via MTJ2 device. In one embodiment, for circuit 430, to store or save a "zero," MP3 and MN4 are turned ON causing current to flow from MP3 to MN4 via MTJ2 device.

In one embodiment, devices in 430 can be removed from Save Circuit i.e., Save Circuit includes circuits 400 and 420 without circuit 430. In one embodiment, devices in 500 can be removed from Restore Circuit i.e., Restore Circuit includes devices MN1, MP1, and MTJ1 device without MN2, MP2, and MTJ2 device. In one embodiment, circuit 430 is included in Save Circuit (having circuits 400 and 420) to improve (i.e., add) write margin. In one embodiment, circuit 500 includes MN2, MP2, and MTJ2 device to improve (i.e., add) restore margin.

In one embodiment, to write into each MTJ device, there is a total stack of one MTJ device and two transistors, which ensures sufficient write currents. One technical effect of such a topology is that it enables operation at low power supply voltages (e.g., down to 0.7V supply voltage). In one embodiment, any more devices in the write current path may exponentially increase the save time, in turn increasing the energy dissipated in the store state (i.e., RESTORE (D) in FIG. 2B). In one embodiment, when the core supply shuts down completely, the MTJ devices (i.e., MTJ1 and MTJ2 devices) store the state information magnetically, providing non-volatility and immunity to soft errors.

Figure 5:
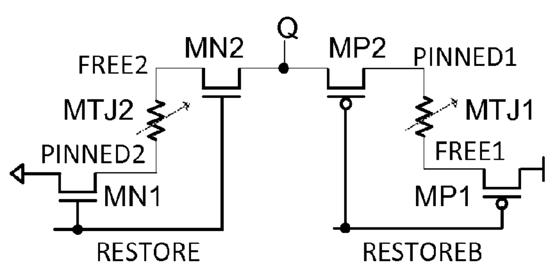
FIG. 5 illustrates a Restore Circuit used by the memory stage of a sequential unit with retention using resistive elements, according to one embodiment of the disclosure.

FIG. 5 illustrates a Restore Circuit 500 (e.g., Restore Circuit 302) used by the memory stage of sequential unit with retention using resistive elements, according to one embodiment of the disclosure. It is pointed out that those elements of FIG. 5 having the same reference numbers (or names) as the elements of any other figure can operate or function in any manner similar to that described, but are not limited to such. FIG. 5 is explained with reference to FIG. 3A.

In one embodiment, Restore Circuit 500 comprises: p-type devices MP1 and MP2, n-type devices MN1 and MN2, and MTJ1 and MTJ2 devices. In one embodiment, source terminal of MP1 is coupled to power supply, drain terminal of MP1 is coupled to free layer (i.e., FREE1) of MTJ1 device, and gate terminal of MP1 is controllable by RESTOREB signal, where RESTOREB is an inverse of RESTORE signal. In one embodiment, source terminal of MP2 is coupled to fixed layer (i.e., PINNED1) of MTJ1 device, drain terminal of MP2 is coupled to node Q of FIG. 3A, and gate terminal of MP2 is controllable by RESTOREB signal.

In one embodiment, source terminal of MN1 is coupled to ground, drain terminal of MN1 is coupled to fixed layer (i.e., PINNED2) of MTJ2 device, and gate terminal of MN1 is controllable by RESTORE signal. In one embodiment, source terminal of MN2 is coupled to free layer (i.e., FREE2) of MTJ2 device, drain terminal of MN2 is coupled to node Q of FIG. 3A, and gate terminal of MN2 is controllable by RESTORE signal.

In one embodiment, when the core supply powers on again, the MTJ devices (i.e., MTJ1 and MTJ2 devices of Restore Circuit 500) restore the data back into the slave. In this embodiment, the restored node connects to the internal node Q of slave stage 301. In one embodiment, MAINCLK is set to logic 1 and CLK and CLKB are gated by the restore state which causes the driver gates (inv2 and TG) to both be floating. In one embodiment, Restore Circuit 500 behaves like a resistance divider with two MTJ devices, two n-type transistors, and two p-type transistors coupled in series. The division occurs with enough margin (e.g., approx. $V_{DD}/3$) to reliably switch the cross-coupled keeper inverters inv2 and inv3 of slave 301 to the restore data value.

In one embodiment, Restore Circuit 500 achieves a six sigma restore margin when all four MOS devices and both MTJ devices experience process variation in a typical advanced process in CMOS. In one embodiment, at a slow process corner (or with high Vt devices), the restore margin increases since the middle n-type device MN2 or p-type device MP2 closest to the MTJ device in the high resistance state sees lower Vgs than that in the other half, which further increases the resistance of that half of the resistive divider.

Restoring a "one" has a risk of writing "zero" (i.e., read-disturb). The embodiment of FIG. 5 reduces the risk of read-disturb. In one embodiment, since the restore path comprises of two MTJ devices, and small sized n-type and p-type devices coupled in series, the currents are safely lower (e.g., two to four times lower) than in the write path.

Figure 6:
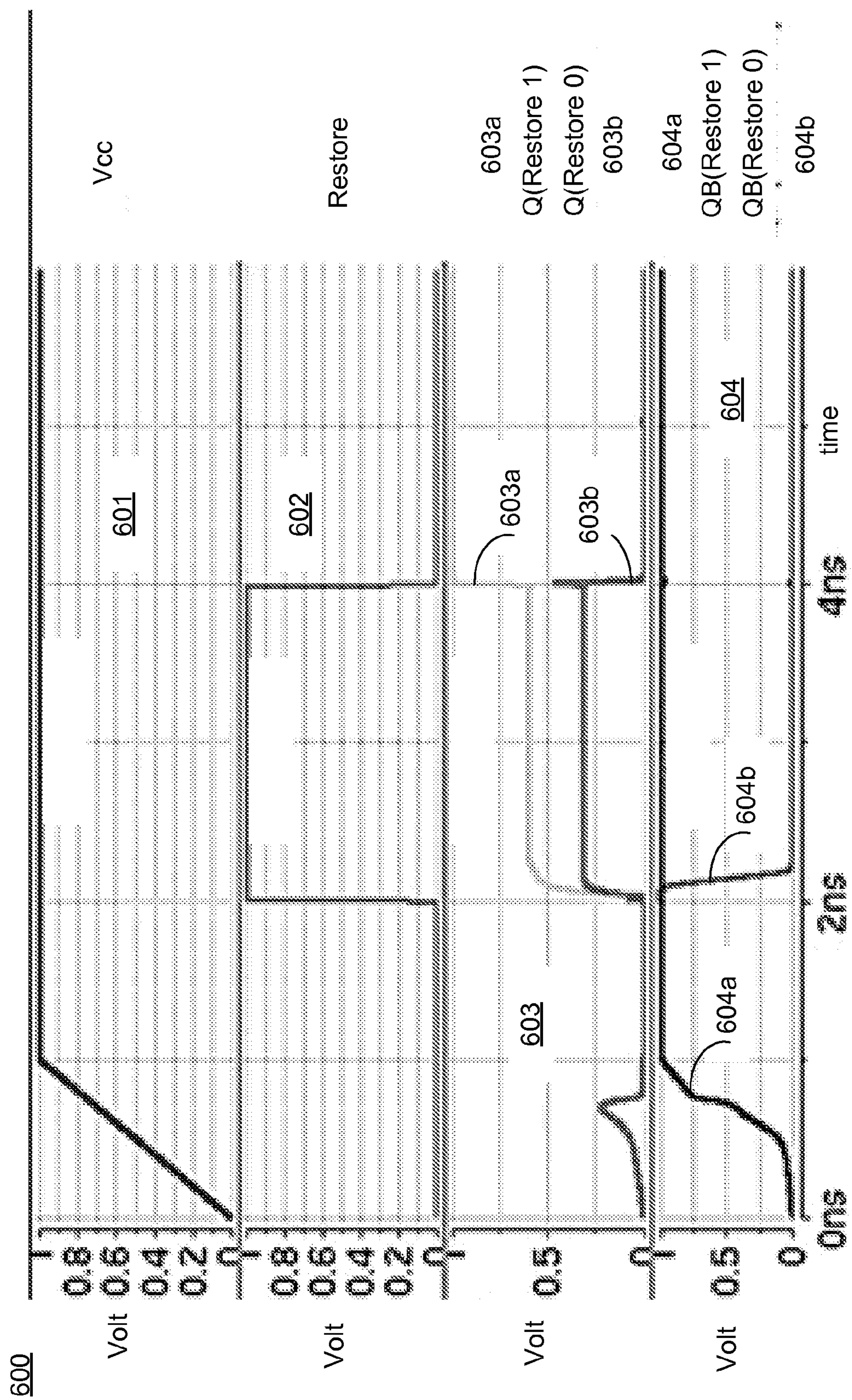
FIG. 6 illustrates plots showing restore operation using the Restore Circuit, according to one embodiment of the disclosure.

FIG. 6 illustrates plot 600 showing operation of restore operation using the restore circuit, according to one embodiment of the disclosure. It is pointed out that those elements of FIG. 6 having the same reference numbers (or names) as the elements of any other figure can operate or function in any manner similar to that described, but are not limited to such.

Here, x-axis is time and y-axis is voltage. Plot 600 includes four plots—601, 602, 603, and 604. Plot 601 illustrates the ramping of power supply Vcc (also referred here as $V_{DD}$). Plot 602 illustrates the enabling of restore operation by RESTORE signal pulse. Here, restore operation begins when RESTORE signal transitions from zero (i.e., logical low) to high and then ends after the RESTORE signal transitions from high to low.

Plot 603 shows two waveforms, 603*a* and 603*b*, which are voltages on node Q when Restore Circuit 500 restores a "one" and a "zero," respectively. Waveform 603*a* shows that voltage on node Q is raised to about ⅔Vcc during the pulse width of RESTORE waveform in plot 602. In this example, the restored data is "one." After restore operation is over (i.e., RESTORE waveform transitions from high to low), slave stage 301 causes node Q to rise to Vcc level (i.e., logical one) from ⅔Vcc level.

Waveform 603*b* shows that voltage on node Q is raised to about ⅓Vcc during the pulse width of RESTORE waveform in plot 602. In this example, the restored data is "zero." After restore operation is over (i.e., RESTORE waveform transitions from high to low), slave stage 301 causes node Q to lower to ground level (i.e., logical low) from ⅓Vcc level. Plot 603 also shows that the restore voltage stabilizes in much less than 1 ns, which is a small enough time to avoid writing the MTJ device. Referring back to FIG. 6, Plot 604 illustrates two waveforms—604*a* and 604*b*—which are voltages on node QB of slave stage 301. Here, waveform 604*b* is the voltage on node QB when restoring a "one" on node Q. Waveform 604*a* is the voltage on node QB when restoring a "zero" on node Q.

Figure 7:
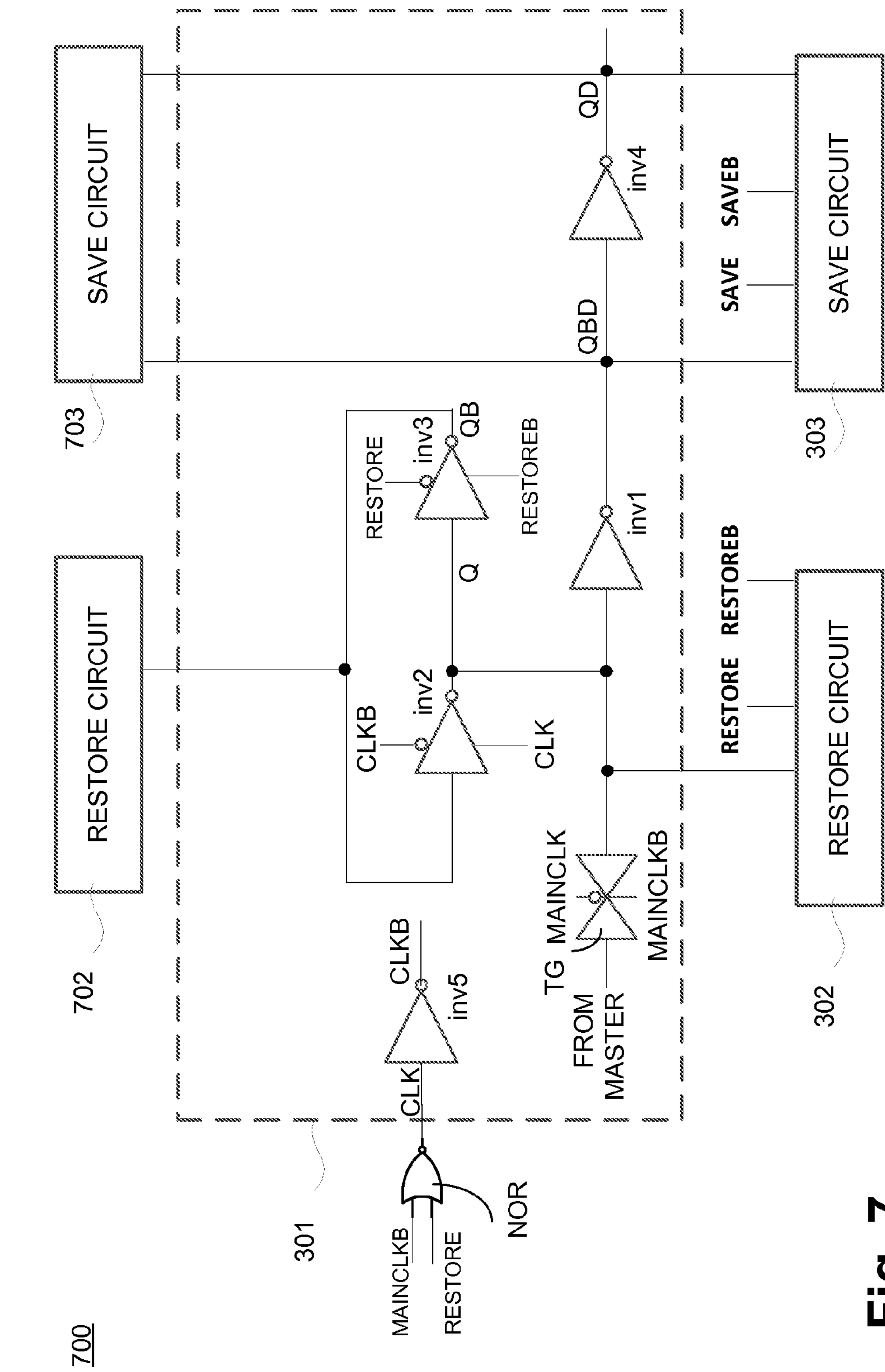
FIG. 7 illustrates a memory stage of a sequential unit with differential retention using resistive elements, according to one embodiment of the disclosure.

FIG. 7 illustrates a memory stage 700 of sequential unit with differential retention using resistive elements, according to one embodiment of the disclosure. It is pointed out that those elements of FIG. 7 having the same reference numbers (or names) as the elements of any other figure can operate or function in any manner similar to that described, but are not limited to such.

The area overhead of additional devices in a flip-flop is small as compared to the initial area of a scan flop. Additional MTJ devices also require minimal area, since they are printed between metal layers (e.g., metal layers M2 and M4), and thus consume no device area. In one embodiment, additional MTJ devices and/or other devices may be added to ensure additional restore margin. In one embodiment, for a simpler design, MTJ devices and/or other devices may be removed if margin can be sacrificed.

The embodiment of FIG. 7 achieves an additional two sigma of restore margin by adding additional MTJ devices for the second inverter in the keeper cell of slave stage 301. The embodiment, of FIG. 7 is explained with reference to FIG. 3A. So as not to obscure the embodiments, differences between FIG. 3A and FIG. 7 are discussed. In one embodiment, memory state 700 comprises second Restore Circuit 702 and second Save Circuit 703 (where first Restore Circuit is Restore Circuit 302 and second Save Circuit is Save Circuit 303).

In one embodiment, Restore Circuit 702 is coupled to node QB and also receives RESTORE and RESTOREB signals. In one embodiment, Save Circuit 703 is coupled to nodes QBD and QD, and also receives SAVE and SAVEB signals. In one embodiment, Restore Circuit 702 operates like Restore Circuit 302. In one embodiment, Save Circuit 703 operates like Save Circuit 303. In one embodiment, inverter inv3 becomes tri-state-able and controlled by the RESTORE and RESTOREB signals, where RESTOREB signal is an inverse of RESTORE signal.

Figure 8:
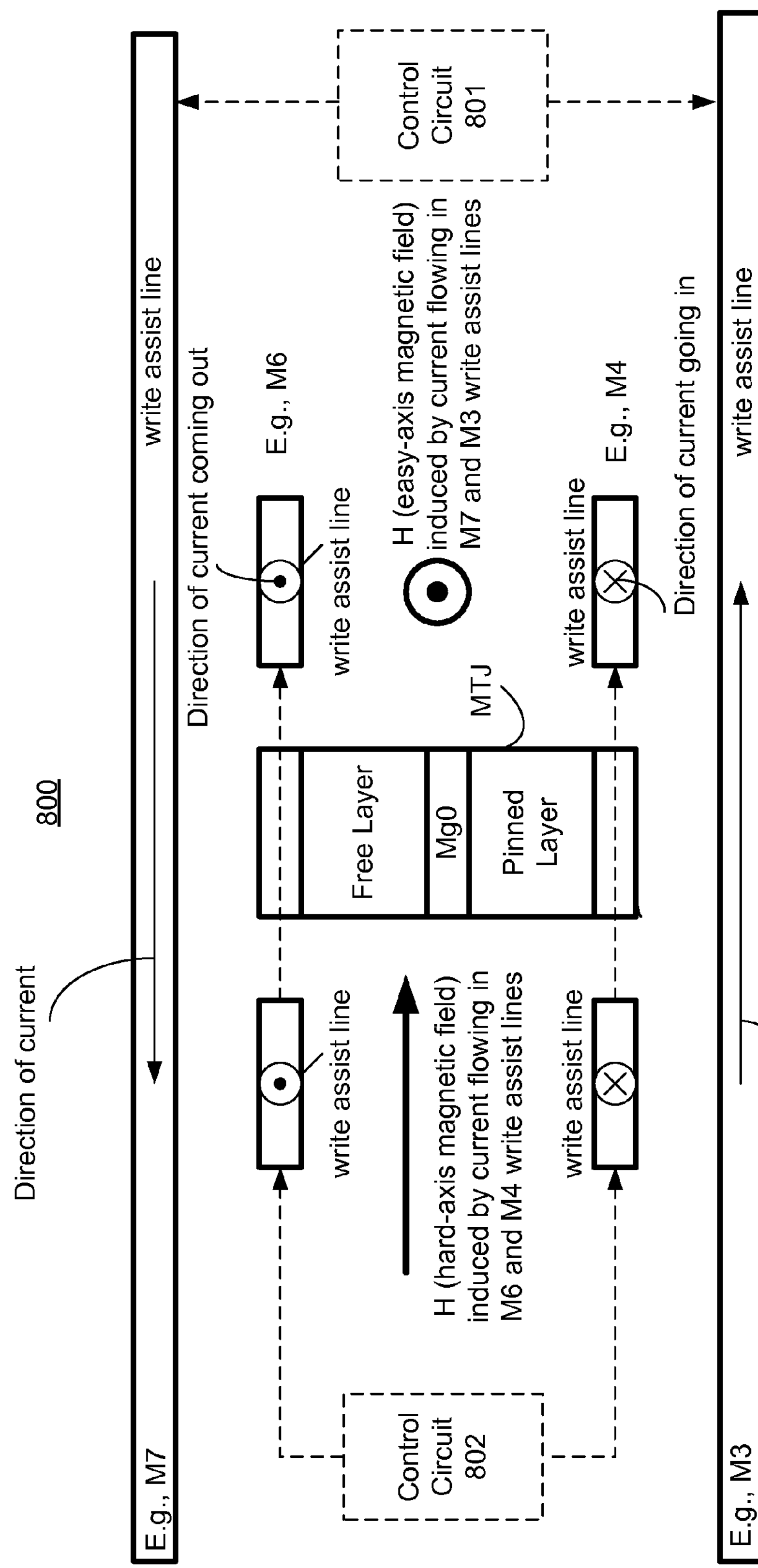
FIG. 8 illustrates an apparatus for improving write margin at low supply voltages for an MTJ device, according to one embodiment of the disclosure.

FIG. 8 illustrates an apparatus 800 for improving write margin at low supply voltages for MTJ device, according to one embodiment of the disclosure. It is pointed out that those elements of FIG. 8 having the same reference numbers (or names) as the elements of any other figure can operate or function in any manner similar to that described, but are not limited to such.

In one embodiment, for lower supply voltages (e.g., supply voltages below 0.7V), technique in apparatus 800 is used to facilitate a write operation that would otherwise not work due to too-low voltage. In one embodiment, an external magnetic field is applied that is either orthogonal to the easy axis of the MTJ device or has an opposite direction to the free layer magnetization to increase the STT (Spin Torque Transfer) susceptibility and to reduce the current used for error-free switching. In one embodiment, the external magnetic field is applied in a pulsed fashion where the timing of pulsed magnetic field is optimized with respect to the STT current to achieve maximum benefit on STT switching. The pulsed magnetic field can be applied before, after or at the same time as the STT current pulse.

In one embodiment, apparatus 800 comprises an MTJ device which is positioned between two metal layers e.g., Metal-4 (M4) and Metal-6 (M6); Control Unit 801, and Control Unit 802. In this example, MTJ device occupies the area of Metal-5 (M5) and its vias to M4 and M6. In other embodiments, MTJ device may be placed in other locations. In this embodiment, pinned or fixed layer of MTJ device is coupled to M4 and free layer of MTJ device is coupled to M6. The fixed and free layers of the MTJ device are separated by an insulator (e.g., MgO).

The dot and cross symbols shown in metal layers M6 and M4 are direction of current. In one embodiment, to improve write margin at low power supply levels, external magnetic field 'H' generated from currents in neighboring metal lines, for example, Metal-3 (M3), Metal-4 (M4), Metal-6(M6) and Metal-7(M7), is applied on the MTJ device. In one embodiment, the direction of current in M7 and M3, and M4 and M6 determines the direction of induced magnetic fields in the MTJ device. In one embodiment, the current in metal layers M7 and M3 induces magnetic field along the easy axis of MTJ device. In one embodiment, the current in metal layers M6 and M4 induces magnetic field along the hard axis of MTJ device.

In one embodiment, the timing of current pulses in metal layers M7, M6, M4 and M3 are designed to provide optimal combination of hard-axis and easy-axis fields to facilitate low-voltage STT switching of MTJ device. In one embodiment, Control Circuit 801 derives current in metal layers M7 and M3 near the MTJ device to induce easy-axis field in the MTJ device to improve write margin. In one embodiment, Control Circuit 802 drives current in metal layers M6 and M4 near the MTJ device to induce hard-axis field in the MTJ device to improve write margin. In one embodiment, Control Circuits 801 and 802 can be turned ON separately or simultaneously to achieve optimal write margin with lowest power consumption.

Figure 9A:
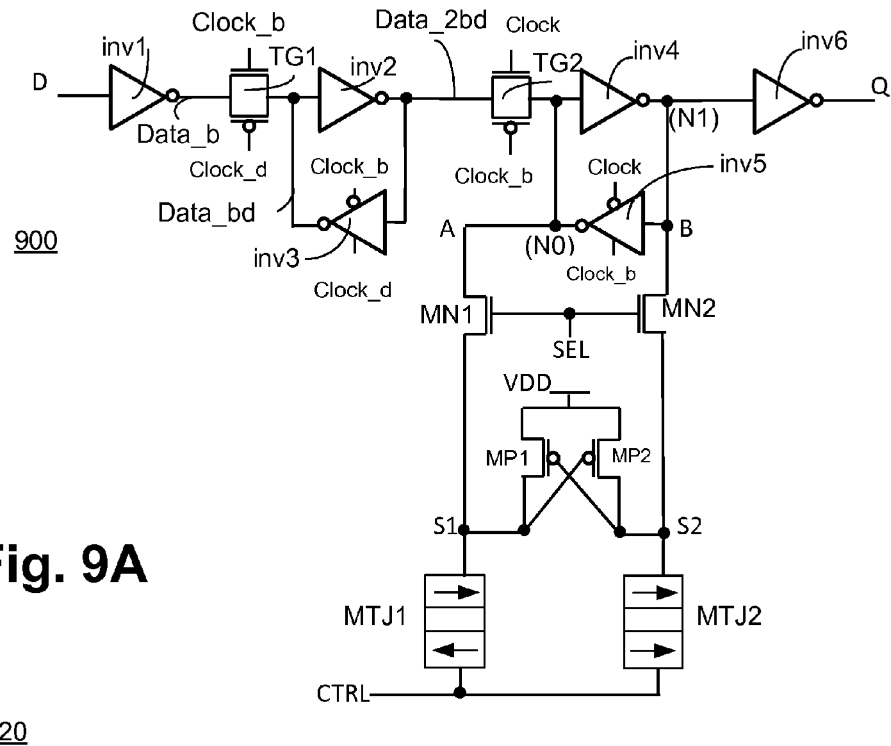
FIG. 9A illustrates a flip-flop with retention circuits using MTJ devices, according to one embodiment of the disclosure.

FIG. 9A illustrates flip-flop 900 with retention circuits using MTJ devices, according to one embodiment of the disclosure. It is pointed out that those elements of FIG. 9A having the same reference numbers (or names) as the elements of any other figure can operate or function in any manner similar to that described, but are not limited to such. FIG. 9A is described with reference to FIG. 1E. So as not to obscure the embodiments, differences between FIG. 9A and FIG. 1E are described.

In one embodiment, flip-flop 900 comprises cross-coupled p-type devices MP1 and MP2. In one embodiment, source terminals of MP1 and MP2 are coupled to power supply $V_{DD}$. In one embodiment, gate and drain terminal of MP1 is coupled to the pinned layer of MTJ2 device at node S2. In one embodiment, gate and drain terminal of MP2 is coupled to the pinned layer of MTJ1 device at node S1. Nodes S1 and S2 are also referred here as pre-charge nodes.

During normal operation, functioning of flip-flop 900 is similar to that of flip-flop 150. For example, MTJ devices (MTJ1 device and MTJ2 device) are disconnected from nodes A and B by driving the SEL line to $V_{ss}$ (i.e., ground) and the flip-flop functions like a standard retention-less flip-flop. In one embodiment, the CTRL line is driven high to eliminate or reduce the leakage current through MP1 and MP2 and the MTJ devices (i.e., MTJ1 device and MTJ2 device) as well as pre-charge nodes S1/S2 to $V_{DD}$ to prepare for the next store operation.

Figure 9B:
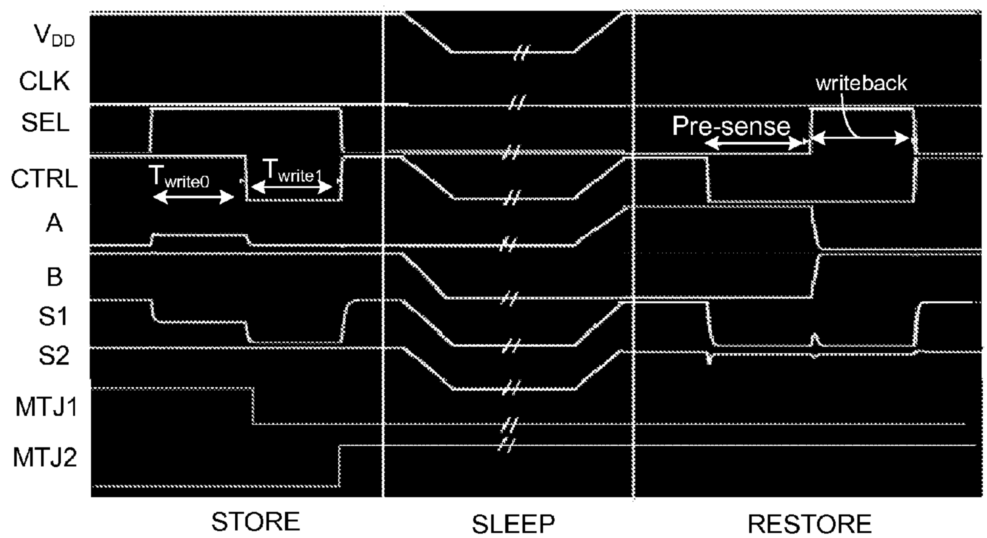
FIG. 9B illustrates a plot showing timing diagram of signals at various nodes of the flip-flop of FIG. 9A, according to one embodiment of the disclosure.

FIG. 9B illustrates a plot 920 showing timing diagram of signals at various nodes of the flip-flop of FIG. 9A when performing store and restore operations according to one embodiment of the disclosure. Plot 920 shows many waveforms stacked. Each waveform has its own y-axis, which is voltage from 0 to $V_{DD}$. Here, x-axis is time. Plot 920 is divided into three sections—STORE, SLEEP, and RESTORE. Plot 920 shows voltage signal behavior at nodes $V_{DD}$, CLK (i.e., Clock or Clock_d), SEL, CTRL, A, B, S1, S2, and voltages stored in MTJ1 device and MTJ2 device.

In one embodiment, to store the state of flip-flop 900 in the MTJ devices, clock is gated first (i.e., CLK=‘0’), the CTRL line is kept coupled to $V_{DD}$ and then the pass transistors MN1 and MN2 are turned ON by driving SEL line high. Here, “Clock_d” and “Clock” signals are same as “CLK” signal, and “Clock_b” is same as “CLKB” signal.

In this embodiment, the state of MTJ1 device is switched to parallel orientation or ‘0’ state resulting in write ‘0’ operation (assuming node A stores ‘0’) from anti-parallel orientation. In one embodiment, in the next step, CTRL line is driven low keeping the SEL line high, resulting in write ‘1’ operation to MTJ2 device (assuming node B stores ‘1’). In one embodiment, cross-coupled MP2 helps write ‘1’ operation by conducting strong ‘1’ to node S2 and this overcomes the source degeneration problem that is found in flip-flop 150 of FIG. 1E. Referring back to FIGS. 9A-B, in one embodiment, the sizing of n-type pass transistors MN1 and MN2 and those in the slave latch is determined by the current required to perform write ‘0’ to the MTJ device which is intrinsically low compared to that of write ‘1’ from device physics.

In order to perform the restore operation, in one embodiment, the CTRL line is first driven high after the supply voltage has been turned ON while CLK=‘0.’ In this embodiment, nodes S1 and S2 are pre-charged to $V_{DD}$. Next, in one embodiment, CTRL line is driven low. In this embodiment, differential current flows through MTJ1 device and MTJ2 device depending on the stored data. In one embodiment, the MTJ device with low resistance state (say MTJ1 device after the previous store operation) conducts larger current for discharging node S1 faster. In this embodiment, cross-coupled MP1 is turned ON which charges node S2 close to $V_{DD}$. In this embodiment, cross-coupled MP1 and MP2 act as a pre-sense amplifier during restore operation.

In the next step, in one embodiment, pass transistors MN1 and MN2 are turned ON by driving SEL line high. In this embodiment, the differential voltages developed at nodes S1 and S2 are then used to fully restore the state of MTJ devices into nodes A and B, which in the worst-case comes back from sleep with opposite polarity to that stored in the MTJ devices (i.e., A=‘1,’ and B=‘0’). In this embodiment, cross-coupled MP1 and MP2 (i.e., pre-sense amplifier) helps to significantly mitigate the impact of the asymmetry in the slave stage on restore operation.

Figure 9C:
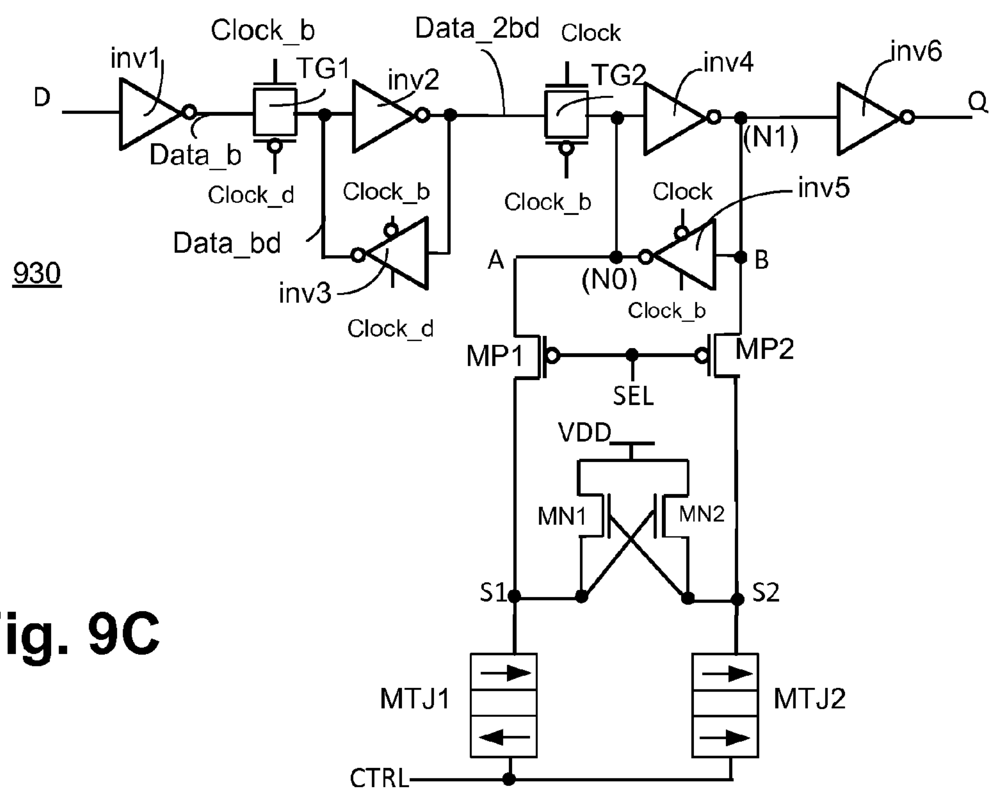
FIG. 9C illustrates a flip-flop with retention circuits using MTJ devices, according to another embodiment of the disclosure.

FIG. 9C illustrates flip-flop 930 with retention circuits using MTJ devices, according to another embodiment of the disclosure. It is pointed out that those elements of FIG. 9C having the same reference numbers (or names) as the elements of any other figure can operate or function in any manner similar to that described, but are not limited to such. FIG. 9C is described with reference to FIG. 9A. Flip-flop 930 behaves similarly to flip-flip 900. So as not to obscure the embodiments, differences between FIG. 9A and FIG. 9C are described. Compared to FIG. 9A, in one embodiment, flip-flop 930 uses n-type cross-coupled transistors MN1 and MN2 (instead of MP1 and MP2 of FIG. 9A), and uses p-type pass transistors MP1 and MP2 (instead of pass transistors MN1 and MN2 of FIG. 9A).

Figure 10A:
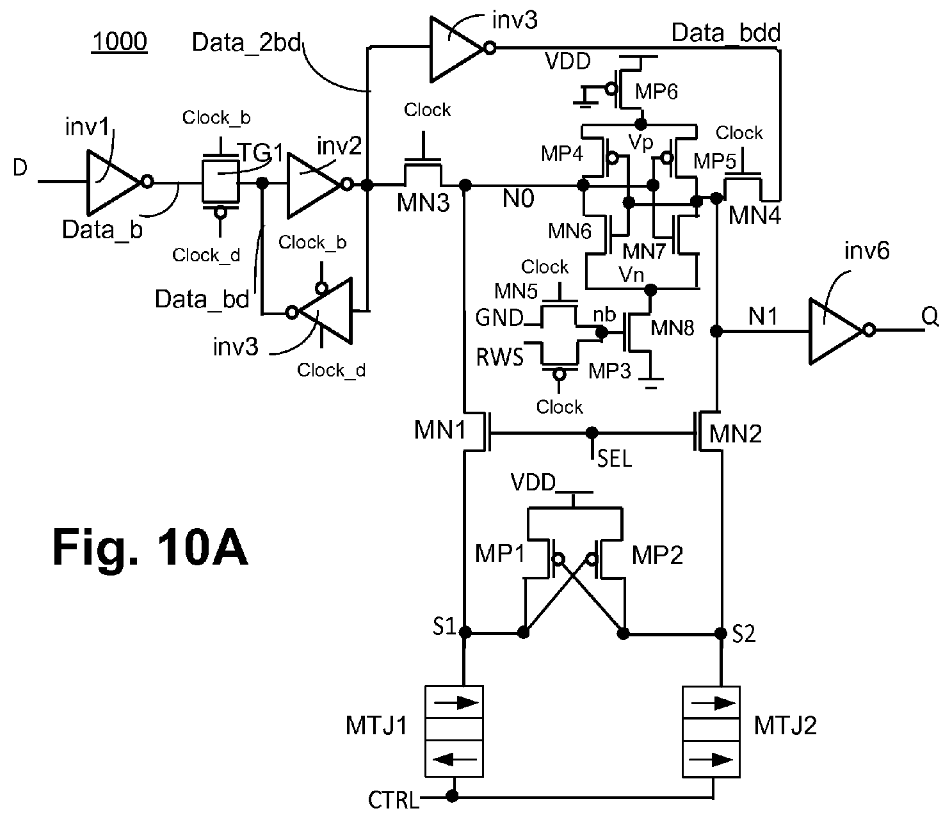
FIG. 10A illustrates a flip-flop with retention circuits using MTJ devices, according to one embodiment of the disclosure.

FIG. 10A illustrates flip-flop 1000 with retention circuits using MTJ devices, according to one embodiment of the disclosure. It is pointed out that those elements of FIG. 10A having the same reference numbers (or names) as the elements of any other figure can operate or function in any manner similar to that described, but are not limited to such. FIG. 10A is described with reference to FIG. 1E and FIG. 9A. So as not to obscure the embodiments, differences between FIG. 9A and FIG. 10A are described.

One of the design attributes of flip-flop 900 is that the cross-coupled transistors MP1 and MP2 are sized to be strong enough to flip the state of slave latch during restore operation. This may require upsizing of cross-coupled MP1 and MP2 transistors that may result in area penalty. In one embodiment, by decoupling the cross-coupled inverters inv4 and inv5 of flip-flop 900 and designing a symmetric slave latch, this design requirement can be considerably relaxed. Flip-flop 1000 illustrates one such embodiment.

Figure 10B:
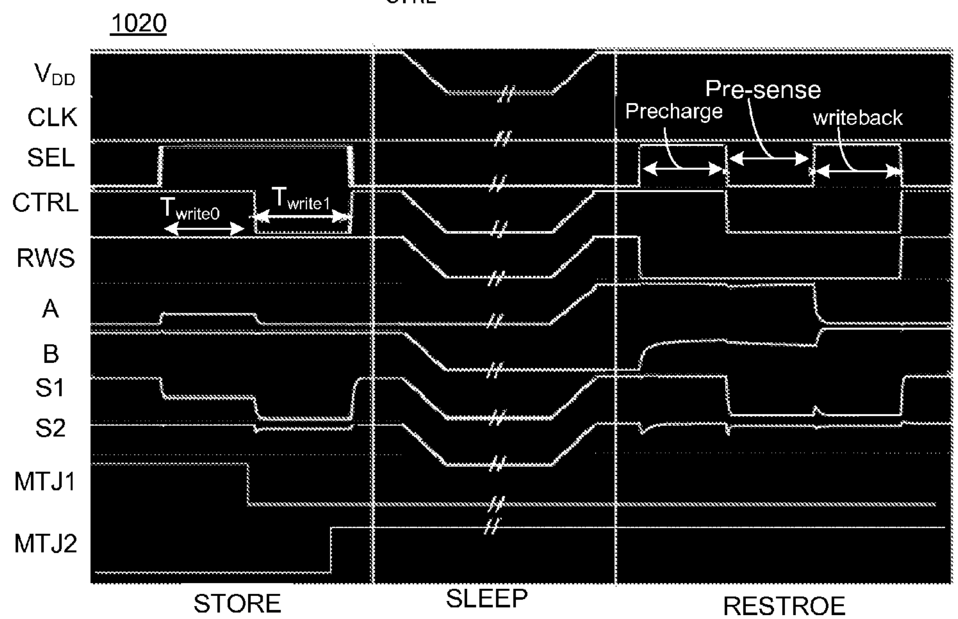
FIG. 10B illustrates a plot showing timing diagram of signals at various nodes of the flip-flop of FIG. 10A, according to one embodiment of the disclosure.

FIG. 10B illustrates a plot 1020 showing timing diagram of signals at various nodes of the flip-flop 1000 of FIG. 10A, according to one embodiment of the disclosure. Plot 1020 shows many waveforms stacked. Each waveform has its own y-axis, which is voltage from ‘0’ to $V_{DD}$. Here, x-axis is time. Plot 1020 is divided into three sections—STORE, SLEEP, and RESTORE. Plot 1020 shows voltage signal behavior at nodes $V_{DD}$, CLK (i.e., Clock or Clock_d signals), SEL, CTRL, A, B, S1, S2, and voltages stored in MTH device and MTJ2 device.

In one embodiment, the asymmetric cross-coupled inverters inv4 and inv5 of flip-flop 900 are replaced with symmetric cross-coupled inverters having header transistor MP6, footer transistor MN8, and cross-coupled devices MP4, MP5, MN6, and MN7. In one embodiment, source terminal of header MP6 is coupled to $V_{DD}$, drain terminal of MP6 is coupled to drain terminals (i.e., node Vp) of MP4 and MP5, and gate terminal of MP6 is coupled to ground. In one embodiment, drain terminal (i.e., node Vn) of footer MN8 is coupled to source terminals of MN6 and MN7, source terminal of MN8 is coupled to ground, and gate terminal of MN8 is coupled to MN5 and MP3.

In one embodiment, pass-transistor MN3 is placed between output of inverter inv2 and node N0. In one embodiment, pass-transistor MN4 is placed between output of inverter inv3 and node N1. Here, inverter inv3 is coupled to node Data_2*bd* and outputs Data_bdd. In one embodiment, both MN3 and MN4 are controllable by Clock signals. In one embodiment, MN5 is controllable by Clock and is operable to couple GND (ground) to node nb (i.e., gate terminal of footer MN8). In one embodiment, MP3 is controllable by Clock and is operable to couple RWS (i.e., Restore) signal to node nb (i.e., gate terminal of footer MN8).

During normal operation, in one embodiment, RWS is driven high. When CLK (i.e., Clock and Clock_d) is high, in one embodiment, the pull-down path is incomplete enabling easier (or contention free) writing of data from the master stage to the slave latch during normal operation of flip-flop 1000. In one embodiment, when CLK is low, the cross-coupled inverters of the slave stage are completed by driving the gate of MN8 device to high since RWS remains high.

In one embodiment, the store operation in the flip-flop 1000 is similar to that of flip-flop 900. In order to perform restore operation, in one embodiment, CTRL line is driven high, RWS and CLK are driven low, and SEL line is coupled to $V_{DD}$. In this embodiment, nodes A and B of the slave latch are pre-charged to about $V_{DD}$-$V_{TH}$. Next, in one embodiment, SEL and CTRL lines are driven low. In this embodiment, differential currents flows through the MTJ devices which develop differential voltages at nodes S1 and S2. Then, in one embodiment, the SEL signal is driven high one more time to create appropriate differential voltages at nodes A and B. Next, in one embodiment, RWS signal is driven high to complete the pull-down path of the more symmetric slave latch. In this embodiment, and through the combination of symmetric cross-coupled slave latch with pre-charged nodes as well as pre-sensing using MP1 and MP2, variation-tolerant restore operation is performed which considerably relaxes the sizing requirement of cross-coupled MP1 and MP2.

Figure 10C:
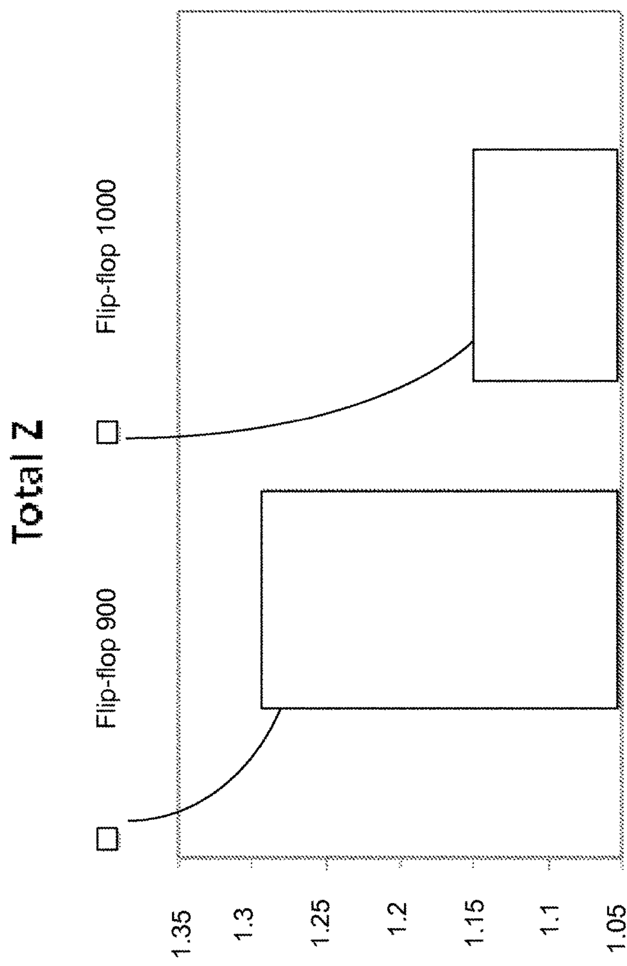
FIG. 10C illustrates a plot comparing normalized total device width of the embodiments of FIG. 9A and FIG. 10A, according to one embodiment of the disclosure.

FIG. 10C illustrates a plot 1030 comparing normalized total device width (Z) of the embodiments of FIG. 9A and FIG. 10A, according to one embodiment of the disclosure. It is pointed out that those elements of FIG. 10C having the same reference numbers (or names) as the elements of any other figure can operate or function in any manner similar to that described, but are not limited to such.

The increase in total-Z with flip-flop 900 is due to upsizing of cross-coupled MP1 and MP2. The embodiment of flip-flop 1000 relaxes the sizing requirement, which results in considerable reduction in total-Z of the design. The embodiments of flip-flop 900 and flip-flop 1000 do not use any Always-ON power supply which saves layout congestion of metal lines. The CMOS retention flip-flop 130 of FIG. 1C has significantly higher layout area than layout areas of flip-flop 900 and flip-flop 1000 because from the requirement of separate N-wells due to separate voltage supplies to master and slave stages of CMOS retention flip-flop 150.

Figure 11:
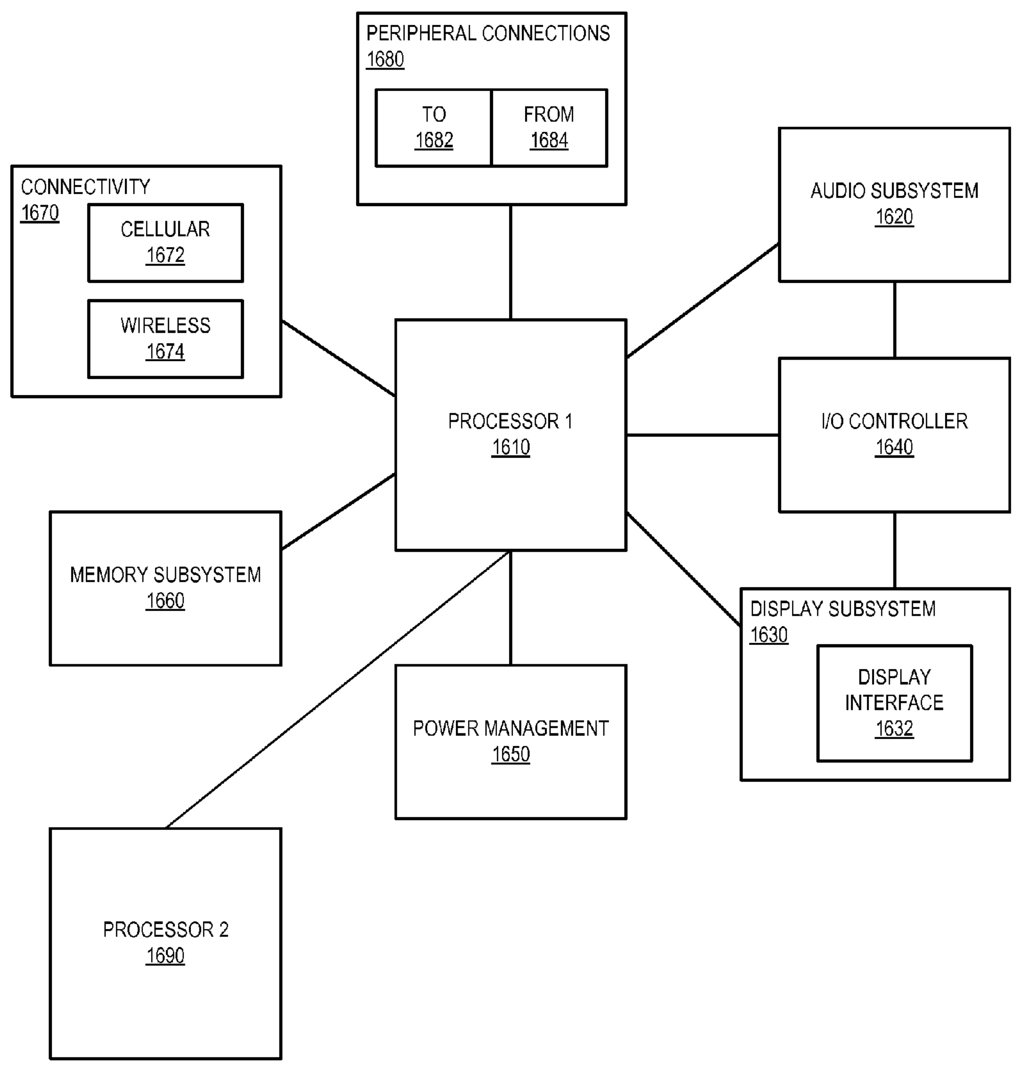
FIG. 11 is a smart device or a computer system or an SoC (System-on-Chip) with the memory cell with retention using resistive element(s), according to one embodiment of the disclosure.

FIG. 11 is a smart device or a computer system or an SoC (System-on-Chip) with the memory cell with retention using resistive element(s), according to one embodiment of the disclosure. It is pointed out that those elements of FIG. 11 having the same reference numbers (or names) as the elements of any other figure can operate or function in any manner similar to that described, but are not limited to such.

FIG. 11 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with the memory cell with retention using resistive memory element(s) described with reference to embodiments discussed. Other blocks of the computing device 1600 may also include apparatus of the memory cells with retention using resistive memory element(s) described with reference to embodiments. The various embodiments of the present disclosure may also comprise a network interface within 1670 such as a wireless interface so that a system embodiment may be incorporated into a wireless device, for example, cell phone or personal digital assistant or a wearable device.

In one embodiment, processor 1610 (and processor 1690) can include one or more physical devices, such as microprocessors, application processors, microcontrollers, programmable logic devices, or other processing means. Processor 1690 may be optional. While the embodiment shows two processors, a single or more than two processors may be used. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment apparatus is provided which comprises: a memory element including a first inverting device cross-coupled to a second inverting device; a restore circuit having at least one resistive memory element, the restore circuit coupled to an output of the first inverting device; a third inverting device coupled to the output of the first inverting device; a fourth inverting device coupled to an output of the third inverting device; and a save circuit having at least one resistive memory element, the save circuit coupled to an output of the third inverting device.

In one embodiment, the first inverting device is controllable by a clock signal. In one embodiment, the apparatus further comprises a transmission gate coupled to the memory element, the transmission gate controllable by the clock signal such that when the transmission gate is turned on, the first inverting device is in tri-state. In one embodiment, the save circuit comprises: a first logic unit coupled to the output of the first inverting device, the first logic unit to also receive a signal; and a second logic unit coupled to the output of the fourth inverting device, the second logic unit to also receive the signal. In one embodiment, the first and second logic units are NAND gates.

In one embodiment, the save circuit further comprises: a first p-type device coupled in series to a first n-type device; a second p-type device coupled in series to a second n-type device; and a first resistive element coupled to the first and second p-type devices and to the first and second n-type devices, wherein the first and second p-type devices and the first and second n-type devices are controllable by outputs of the first and second logic units. In one embodiment, the first resistive element is a Magnetic Tunnel Junction (MTJ) device including: a free magnetic layer coupled to the first p-type device and the first n-type device; and a fixed magnetic layer coupled to the second p-type device and the second n-type device.

In one embodiment, the save circuit further comprises: a third p-type device coupled in series to a third n-type device; a fourth p-type device coupled in series to a fourth n-type device; and a second resistive element coupled to the third and fourth p-type devices and to the third and fourth n-type devices, wherein the third and fourth p-type devices and the third and fourth n-type devices are controllable by outputs of the first and second logic units.

In one embodiment, the second resistive element is a Magnetic Tunnel Junction (MTJ) device including: a free magnetic layer coupled to the third p-type device and the third n-type device; and a fixed magnetic layer coupled to the fourth p-type device and the fourth n-type device. In one embodiment, the restore circuit comprises: a first p-type device coupled to a power supply node; a first resistive element coupled to the first p-type device; and a second p-type device coupled to the first resistive element and the output of the first inverting device. In one embodiment, the first resistive element is a Magnetic Tunnel Junction (MTJ) device including: a free magnetic layer coupled to the first p-type device; and a fixed magnetic layer coupled to the second p-type device. In one embodiment, the restore circuit comprises: a first n-type device coupled to a ground node; a second resistive element coupled to the first n-type device; and a second n-type device coupled to the second resistive element and the output of the first inverting device, the second n-type device further coupled to the second p-type device.

In one embodiment, the second resistive element is a Magnetic Tunnel Junction (MTJ) device including: a free magnetic layer coupled to the first n-type device; and a fixed magnetic layer coupled to the second n-type device. In one embodiment, the at least one resistive memory element of the restore circuit and the save circuit is at least one of: magnetic tunnel junction (MTJ) device; conductive bridge RAM (CBRAM), or bi-stable organic memories. In one embodiment, the apparatus further comprises: another restore circuit having at least one resistive memory element, the other restore circuit coupled to an output of the second inverting device. In one embodiment, the apparatus further comprises: another save circuit having at least one resistive memory element, the save circuit coupled to the outputs of the third and fourth inverting devices. In one embodiment, the memory element is part of one of: a flip-flop; a latch; or a static random memory.

In another example, a system is provided which comprises: a memory unit; a processor, coupled to the memory unit, the processor including an apparatus according to the apparatus discussed above; and a wireless interface for allowing the processor to communicate with another device. In one embodiment, the system further comprises a display unit. In one embodiment, the display unit is a touch screen.

In another example, a flip-flip is provided which comprises: a slave stage coupled to a master stage, the slave stage having first and second storage nodes; and a retention stage coupled to the first and second storage nodes of the slave stage, the retention stage including: a first pass transistor controllable by a select signal, the first pass transistor coupled to the first storage node; a second pass transistor controllable by the select signal, the second pass transistor coupled to the second storage node; a first resistive memory element coupled at one end to the first pass transistor, and coupled to a control node at another end; a second resistive memory element coupled at one end to the first pass transistor, and coupled to a control node at another end; and a cross-coupled pair of transistors coupled to the first and second resistive memory elements and first and second pass transistors.

In one embodiment, the cross-coupled pair of transistors comprises: a first transistor coupled to a supply node and the first resistive memory element, the first transistor having a gate terminal coupled to the second resistive memory element. In one embodiment, the cross-coupled pair of transistors comprises: a second transistor coupled to a supply node and the second resistive memory element, the second transistor having a gate terminal coupled to the first resistive memory element. In one embodiment, the first and second transistors are p-type transistors. In one embodiment, the first and second pass transistors are n-type transistors. In one embodiment, the first and second resistive memory elements are at least one of: magnetic tunnel junction (MTJ) device; conductive bridge RAM (CBRAM), or bi-stable organic memories.

In another example, a system is provided which comprises: a memory unit; a processor, coupled to the memory unit, the processor including a flip-flop according to the flip-flop described above; and a wireless interface for allowing the processor to communicate with another device. In one embodiment, the system further comprises a display unit. In one embodiment, the display unit is a touch screen.

In another example, an apparatus is provided which comprises: a master stage; a slave stage coupled to the master stage, the slave stage including: a first inverter coupled to the master stage; cross-coupled inverters coupled to first and second storage nodes; a first pass transistor coupled to the master stage, input of the first inverter, and the first storage node; and a second pass transistor coupled to an output of the first inverter and to the second storage node; and a retention stage coupled to the first and second storage nodes.

In one embodiment, the cross-coupled inverters share a p-type header device and an n-type footer device. In one embodiment, a gate terminal of the p-type header device is coupled to ground. In one embodiment, a gate terminal of the n-type footer device is coupled to a selection unit. In one embodiment, the selection unit comprises: a first pass transistor controllable by a clock signal and coupled at one end to the gate terminal of the n-type footer device, and coupled to ground at another end. In one embodiment, the selection unit comprises: a second pass transistor controllable by a clock signal and coupled at one end to the gate terminal of the n-type footer device, and coupled to receive a control signal at another end.

In one embodiment, the retention stage comprises: a first pass transistor controllable by a select signal, the first pass transistor coupled to the first storage node; and a second pass transistor controllable by the select signal, the second pass transistor coupled to the second storage node. In one embodiment, the retention stage comprises: a first resistive memory element coupled at one end to the first pass transistor of the retention stage, and coupled to a control node at another end; a second resistive memory element coupled at one end to the first pass transistor of the retention stage, and coupled to a control node at another end; and a cross-coupled pair of transistors coupled to the first and second resistive memory elements and first and second pass transistors.

In one embodiment, the cross-coupled pair of transistors of the retention stage comprises: a first transistor coupled to a supply node and the first resistive memory element, the first transistor having a gate terminal coupled to the second resistive memory element. In one embodiment, the cross-coupled pair of transistors comprises: a second transistor coupled to a supply node and the second resistive memory element, the second transistor having a gate terminal coupled to the first resistive memory element.

In one embodiment, the first and second transistors are p-type transistors. In one embodiment, the first and second pass transistors are n-type transistors. In one embodiment, the first and second resistive memory elements are at least one of: magnetic tunnel junction (MTJ) device; conductive bridge RAM (CBRAM), or bi-stable organic memories.

In another example, a system is provided which comprises: a memory unit; a processor, coupled to the memory unit, the processor including an apparatus according to the apparatus described above; and a wireless interface for allowing the processor to communicate with another device. In one embodiment, the system further comprises a display unit. In one embodiment, the display unit is a touch screen.

In another example, a apparatus for improving write margin is provided which comprises: an MTJ device positioned between first and second metal layers, the MTJ having a fixed magnetic layer coupled to a third metal layer, and a free magnetic layer coupled to a fourth metal layer; and a first control unit coupled to the first and second metal layers, wherein the first control unit to inject current into the first and second metal layers such that direction of the current in the first metal layer is different than a direction of the current in the second metal layer.

In one embodiment, the apparatus further comprises: a second control unit coupled to the fifth and sixth metal layers, wherein the second control unit is operable to inject current into the fifth and sixth metal layers such that direction of the current in the fifth metal layer is different than a direction of the current in the sixth metal layer. In one embodiment, the first and second control units are operable to turned on simultaneously. In one embodiment, the first and second control units are operable to turned on at different times.

In one embodiment, the third metal layer and the fifth metal layer are at a same metal hierarchy, and wherein the third metal layer and the fifth metal layer are decoupled from one another. In one embodiment, the fourth metal layer and the sixth metal layer are at a same metal hierarchy, and wherein the fourth metal layer and the sixth metal layer are decoupled from one another. In one embodiment, the third metal layer and the fifth metal layer are on M4 metal hierarchy. In one embodiment, the fourth metal layer and the sixth metal layer are on M6 metal hierarchy. In one embodiment, the second control unit is operable to inject current as a current pulse. In one embodiment, the first metal layer is in M3 metal hierarchy, and wherein the second metal layer is in M7 metal hierarchy. In one embodiment, the first control unit is operable to inject current as a current pulse.

In another example, system is provided which comprises: a memory unit; a processor, coupled to the memory unit, the processor including an apparatus according to the apparatus discussed above; and a wireless interface for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:

a memory element including a first inverting device cross-coupled to a second inverting device;

a restore circuit having at least one resistive memory element and at least two input signals to enable the restore circuit, the restore circuit coupled to an output of the first inverting device;

a third inverting device coupled to the output of the first inverting device;

a fourth inverting device coupled to an output of the third inverting device; and a save circuit having at least one resistive memory element and at least two input signals to enable the save circuit, the save circuit coupled to an output of the third inverting device.

2. The apparatus of claim 1, wherein the first inverting device is controllable by a clock signal.

3. The apparatus of claim 2 further comprises a transmission gate coupled to the memory element, the transmission gate controllable by the clock signal such that when the transmission gate is turned on, the first inverting device is in tri-state.

4. The apparatus of claim 1, wherein the save circuit comprises:

a first logic unit coupled to the output of the first inverting device, the first logic unit to also receive a signal; and a second logic unit coupled to the output of the fourth inverting device, the second logic unit to also receive the signal.

5. The apparatus of claim 4, wherein the first and second logic units are NAND gates.

6. The apparatus of claim 4, wherein the save circuit further comprises:

a first p-type device coupled in series to a first n-type device;

a second p-type device coupled in series to a second n-type device; and a first resistive element coupled to the first and second p-type devices and to the first and second n-type devices, wherein the first and second p-type devices and the first and second n-type devices are controllable by outputs of the first and second logic units.

7. The apparatus of claim 6, wherein the first resistive element is a Magnetic Tunnel Junction (MTJ) device including:

a free magnetic layer coupled to the first p-type device and the first n-type device; and a fixed magnetic layer coupled to the second p-type device and the second n-type device.

8. The apparatus of claim 4, wherein the save circuit further comprises:

a third p-type device coupled in series to a third n-type device;

a fourth p-type device coupled in series to a fourth n-type device; and a second resistive element coupled to the third and fourth p-type devices and to the third and fourth n-type devices, wherein the third and fourth p-type devices and the third and fourth n-type devices are controllable by outputs of the first and second logic units.

9. The apparatus of claim 8, wherein the second resistive element is a Magnetic Tunnel Junction (MTJ) device including:

a free magnetic layer coupled to the third p-type device and the third n-type device; and a fixed magnetic layer coupled to the fourth p-type device and the fourth n-type device.

10. The apparatus of claim 1, wherein the restore circuit comprises:

a first p-type device coupled to a power supply node;

a first resistive element coupled to the first p-type device; and a second p-type device coupled to the first resistive element and the output of the first inverting device.

11. The apparatus of claim 10, wherein the first resistive element is a Magnetic Tunnel Junction (MTJ) device including:

a free magnetic layer coupled to the first p-type device; and a fixed magnetic layer coupled to the second p-type device.

12. The apparatus of claim 10, wherein the restore circuit comprises:

a first n-type device coupled to a ground node;

a second resistive element coupled to the first n-type device; and a second n-type device coupled to the second resistive element and the output of the first inverting device, the second n-type device further coupled to the second p-type device.

13. The apparatus of claim 10, wherein the second resistive element is a Magnetic Tunnel Junction (MTJ) device including:

a free magnetic layer coupled to the first n-type device; and a fixed magnetic layer coupled to the second n-type device.

14. The apparatus of claim 1, wherein the at least one resistive memory element of the restore circuit and the save circuit is at least one of:

magnetic tunnel junction (MTJ) device;

conductive bridge RAM (CBRAM), or bi-stable organic memories.

15. The apparatus of claim 1 further comprises:

another restore circuit having at least one resistive memory element, the other restore circuit coupled to an output of the second inverting device.

16. The apparatus of claim 1 further comprises:

another save circuit having at least one resistive memory element, the save circuit coupled to the outputs of the third and fourth inverting devices.

17. The apparatus of claim 1, wherein the memory element is part of one of:

a flip-flop;

a latch; or a static random memory.

18. A system comprising:

a memory unit;

a processor, coupled to the memory unit, the processor including an apparatus according to any one of apparatus claims 1 to 17; and a wireless interface for allowing the processor to communicate with another device.

19. The system of claim 18 further comprises a display unit.

20. The system of claim 19, wherein the display unit is a touch screen.

* * * * *